United States Patent
Benton et al.

(10) Patent No.: US 10,388,802 B2
(45) Date of Patent: Aug. 20, 2019

(54) SYSTEM AND METHOD FOR SYNCHRONIZED RAPID SHUTDOWN OF ELECTRICAL DEVICES

(71) Applicant: SolarOff Systems, LLC, Collegeville, PA (US)

(72) Inventors: Andrew Benton, Blue Bell, PA (US); Jon Costanza, Collegeville, PA (US)

(73) Assignee: SOLAROFF SYSTEMS, LLC

( * ) Notice: Subject to any disclaimer, the term of this patent is extended or adjusted under 35 U.S.C. 154(b) by 224 days.

(21) Appl. No.: 15/202,891

(22) Filed: Jul. 6, 2016

(65) Prior Publication Data

US 2017/0012431 A1    Jan. 12, 2017

Related U.S. Application Data

(60) Provisional application No. 62/188,807, filed on Jul. 6, 2015.

(51) Int. Cl.
*H01L 31/00* (2006.01)
*H01L 31/02* (2006.01)
(Continued)

(52) U.S. Cl.
CPC ....... *H01L 31/02021* (2013.01); *H02H 5/047* (2013.01); *H02H 7/20* (2013.01); *H02S 50/00* (2013.01); *Y02E 10/50* (2013.01)

(58) Field of Classification Search
CPC .................................................. H01L 31/02021
(Continued)

(56) References Cited

U.S. PATENT DOCUMENTS

| 6,218,605 B1 | 4/2001 | Dally et al. |
| 6,593,520 B2 | 7/2003 | Kondo et al. |

(Continued)

FOREIGN PATENT DOCUMENTS

| EP | 2495766 | 9/2012 |
| ES | 1076507 | 3/2012 |

(Continued)

OTHER PUBLICATIONS

Midnite Solare Birdhouse Emergency Disconnect Switch—Red, altE Store, http://www.altestore.com/store/Enclosures-Electrical-Safety/Electrical-Enclosures/Disconnecting-Combiner-Boxes/Midnite-Solar-Birdhouse-Emergency-Disconnect-Switch-Red/p10570/, searched for on Jul. 24, 2014.

(Continued)

*Primary Examiner* — Adi Amrany
(74) *Attorney, Agent, or Firm* — The Belles Group, P.C.

(57) ABSTRACT

In one embodiment, the invention can be a system for simultaneous shutting down electrical device, the system including a plurality of circuits, each circuit including an electrical device, and a control circuit configured to turn the electrical device on and off, each control circuit comprising an isolation transformer; an electrical source providing a control current; a switching device configured to switch on and off; and conductors configured to connect the isolation transformers of the plurality of circuits, the electrical source, and the switching device in series to form a current loop, the current loop transmitting the control current; wherein when the switching device is switched from on to off, the isolation transformers of the plurality of circuits stop receiving the control current, thereby causing the electrical devices of the plurality of circuits to shut off simultaneously.

19 Claims, 19 Drawing Sheets

(51) Int. Cl.
*H02S 50/00* (2014.01)
*H02H 5/04* (2006.01)
*H02H 7/20* (2006.01)

(58) Field of Classification Search
USPC .......................................................... 307/52
See application file for complete search history.

(56) References Cited

U.S. PATENT DOCUMENTS

| | | | |
|---|---|---|---|
| 6,650,031 | B1 | 11/2003 | Goldack |
| 6,653,549 | B2 | 11/2003 | Matsushita et al. |
| 6,917,298 | B2 | 7/2005 | Romano et al. |
| 7,385,796 | B2 | 6/2008 | Flanders |
| 7,807,919 | B2 | 10/2010 | Powell et al. |
| 7,884,278 | B2 | 2/2011 | Powell et al. |
| 8,854,193 | B2 | 10/2014 | Makhota et al. |
| 8,933,321 | B2 | 1/2015 | Hadar et al. |
| 9,960,667 | B2 * | 5/2018 | Adest .................. H02J 1/102 |
| 2006/0231132 | A1 | 10/2006 | Neussner |
| 2008/0097655 | A1 * | 4/2008 | Hadar .................. H02J 13/002 |
| | | | 700/286 |
| 2009/0114263 | A1 | 5/2009 | Powell et al. |
| 2010/0139734 | A1 | 6/2010 | Hadar et al. |
| 2010/0253517 | A1 | 10/2010 | Balbo et al. |
| 2010/0269889 | A1 | 10/2010 | Reinhold et al. |
| 2011/0218687 | A1 | 9/2011 | Hadar et al. |
| 2012/0175964 | A1 * | 7/2012 | Yoscovich ............ H02J 3/383 |
| | | | 307/82 |
| 2013/0009483 | A1 * | 1/2013 | Kawate .................. H02J 3/383 |
| | | | 307/77 |
| 2013/0154380 | A1 | 6/2013 | Willer |
| 2013/0200710 | A1 | 8/2013 | Robbins |
| 2014/0345667 | A1 * | 11/2014 | Hudson .................. H01L 31/05 |
| | | | 136/244 |
| 2014/0373895 | A1 * | 12/2014 | Yoshidomi ............ H02H 7/20 |
| | | | 136/244 |
| 2014/0375145 | A1 | 12/2014 | Volz |
| 2015/0189705 | A1 * | 7/2015 | Ghosh .................. H02J 3/38 |
| | | | 315/161 |
| 2016/0036235 | A1 * | 2/2016 | Getsla .................. H02J 3/383 |
| | | | 307/80 |
| 2016/0126367 | A1 * | 5/2016 | Dunton ............ H01L 31/02021 |
| | | | 307/115 |
| 2016/0211797 | A1 * | 7/2016 | Zhu .................. H02S 40/34 |

FOREIGN PATENT DOCUMENTS

| | | |
|---|---|---|
| GB | 2455421 | 6/2009 |
| NL | 8702353 | 5/1989 |
| WO | 2012068618 | 5/2012 |

OTHER PUBLICATIONS

New Inventors: Remote Solar Isolator, http://www.abc.net.au/tv/newinventors/txt/s3187716.htm , searched for on Jul. 21, 2014.

Adam, Mike, NaturalNews.com, Reality chekc: When the power grid goes down, all grid-tie solar systems will go down with it, http://www.naturalnews.com/036194_solar_system_grid-tie_power_grid.html# , Jun. 16, 2012.

Connected World Magazine, "Turn Off That Solar Panel, Now!", http://www.connectedworldmag.com/latestNews.aspx?id=NEWS120106094755177, Jan. 13, 2012.

* cited by examiner

SYSTEM AND METHOD FOR SYNCHRONIZED RAPID SHUTDOWN OF ELECTRICAL DEVICES

CROSS REFERENCE TO RELATED APPLICATIONS

The present application claims the benefit of U.S. Provisional Patent Application No. 62/188,807 filed Jul. 6, 2015, which is incorporated herein by reference.

BACKGROUND

Solar photovoltaic (PV) modules are electricity generating devices. They are frequently mounted on buildings and produce dangerously high voltages when they are exposed to sunlight. This poses life-safety hazards to first responders, in particular firefighters, as well as installers, service technicians, and maintenance personnel. Because of the unique risks posed by solar PV modules, there is growing concern amongst code writers and officials, national and local fire fighter organizations, and insurance companies regarding the ability to completely turn off solar PV modules and systems.

Before the recent proliferation of PV systems, firefighters had been able to assume that all electrical equipment was de-energized and safe if utility (grid) power to a building was shut off or disconnected. This is no longer the case. PV systems and associated DC wiring and equipment are not de-energized by the utility disconnects, and therefore the solar wiring in or on a building will remain fully energized. Even if utility power to a building is shut off or disconnected, solar wiring from the solar PV modules to the DC disconnect or inverter, will remain "hot," typically at 600 or 1000 Volts. The relevant section of the National Electrical Code (NEC) (see section 690 of NEC 2014 and 2017) is being rewritten to address this life-threatening situation. When there is a fire in a building, all energized equipment and wiring needs to be absent of voltage so that it does not impose the risk of electrocution and/or death to firefighters and other first responders. These high voltages can also contribute to the ignition and acceleration of a fire. Ideally, solar PV electrical production is rapidly interrupted if any equipment overheats or short-circuits and is beginning to ignite. Service technicians or maintenance personal should be able to manually turn off a PV system when are working on it.

There have been prior attempts to address the need to shut down electrical equipment and solar PV modules. Thermal fuses and fusible links have been in use in certain configurations to turn off electrical circuits in the event of overheating or fire. U.S. Pat. No. 7,385,796 discloses a heat-meltable link that is used to directly interrupt an electrical circuit. U.S. Pub. No. 2006/0231132 discloses a method to reduce the output voltage of a solar PV module using a thermal switch. U.S. Pat. No. 8,933,321 discloses a method to automatically or remotely shut down a PV system using a central controller.

One might add relays or contactors after the solar module junction box, but these still allow potentially dangerous voltages to reside on the wiring connecting individual solar PV modules and throughout the string. Further, while U.S. Pat. Nos. 7,884,278 and 7,807,919 disclose a manual disconnect switch housed in the solar module junction box, the junction boxes are always attached to the back of the solar PV modules. solar PV modules are typically mounted on a roof, and free standing rack or pole mounted modules by code must be protected so the wires are inaccessible. With no access to the manually-operated disconnects, they are rendered unusable.

Thus, none of these attempts ensure that all solar PV modules in a PV system are shut down simultaneously in a reliable, fail-safe manner where no dangerous voltage is present on any conductors throughout the string and the system. For these reasons, installation crews, maintenance personnel, firefighters and other first responders remain vulnerable to dangerous and life threatening voltages (e.g., 300-1000 Volts) present on conductors throughout the solar PV modules, strings, and system. Accordingly, there is an immediate and urgent need for a reliable and failsafe shut-down system that will simultaneously de-energize the output of all solar PV modules and associated wiring rapidly and safely.

BRIEF SUMMARY

The present disclosure is directed to a system, apparatus, and method for shutting down electrical devices. In one aspect, a system includes a plurality of circuits, each circuit including an electrical device, and a control circuit configured to turn the electrical device on and off, each control circuit comprising an isolation transformer; an electrical source providing a control current; a switching device configured to switch on and off; and conductors configured to connect the isolation transformers of the plurality of circuits, the electrical source, and the switching device in series to form a current loop, the current loop transmitting the control current; wherein when the switching device is switched from on to off, the isolation transformers of the plurality of circuits stop receiving the control current, thereby causing the electrical devices of the plurality of circuits to shut off simultaneously.

In another aspect, a circuit includes a solar photovoltaic module comprising photovoltaic cells; and a control circuit configured to turn the solar photovoltaic module on and off, the control circuit comprising a depletion mode MOSFET operably coupled to the solar photovoltaic module and to a switching device, the depletion mode MOSFET having an on state and an off state; wherein, upon the switching device switching from a first state to a second state, the depletion mode MOSFET switches to the on state to short the photovoltaic cells, thereby shutting off the solar photovoltaic module.

In another aspect, a method of shutting down a plurality of solar modules simultaneously includes providing a plurality of circuits, each circuit including a solar photovoltaic module, and a control circuit configured to turn the solar photovoltaic module on and off, each control circuit comprising an isolation transformer; providing an electrical source configured to provide a control current; providing a switching device configured to switch on and off; and electrically connecting the isolation transformers, the electrical source, and the switching device in series to form a current loop, the current loop transmitting the control current; and switching the switching device from on to off to stop the transmission of the control current in the current loop.

In another aspect, a system includes an electrical source generating a control current; a control device configured to turn an electrical device on and off based on receipt of the control current; and low melting point wire operably coupling the electrical source and the control device in series; wherein when the low melting point wire melts due to overheating, the control device stops receiving the control current, thereby causing the control device to turn off the electrical device.

BRIEF DESCRIPTION OF THE DRAWINGS

The present disclosure will become more fully understood from the detailed description and the accompanying drawings, wherein.

DETAILED DESCRIPTION

Figure 1:
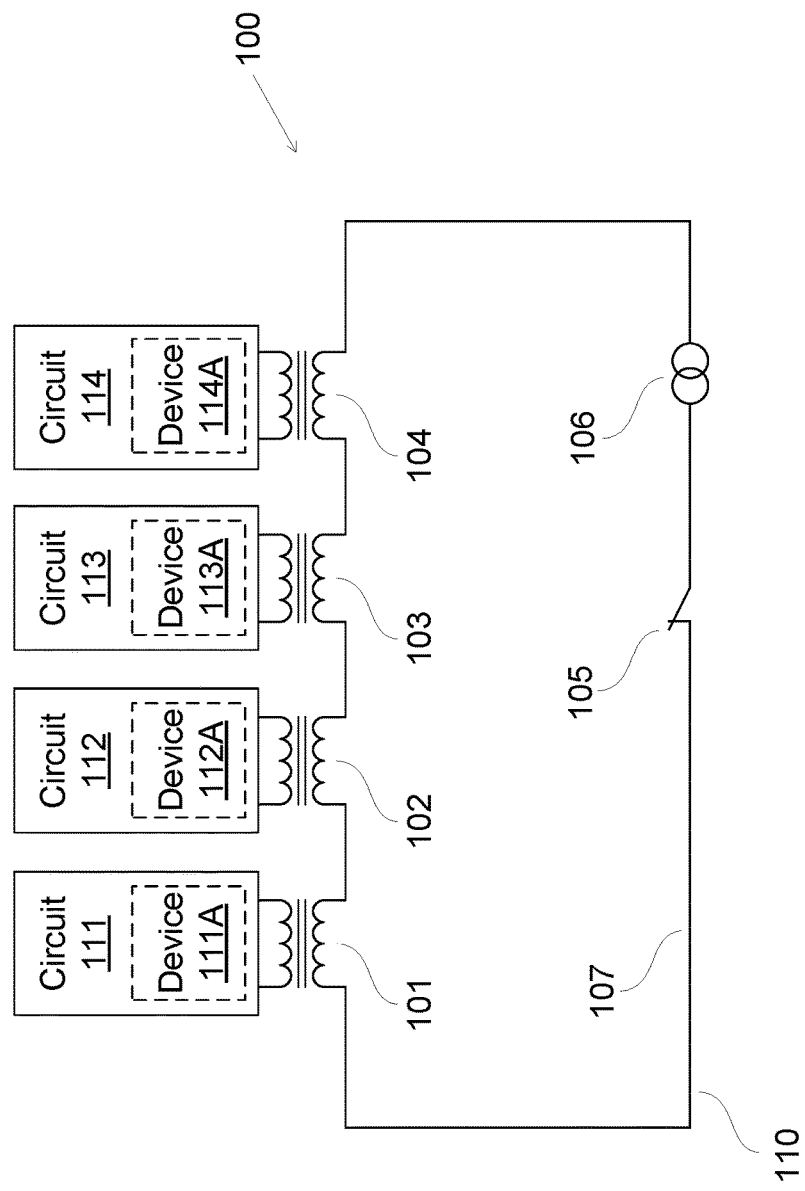
FIG. 1 is a schematic of a system utilizing a current loop to control multiple devices according to an embodiment.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true.

Current loops are inherently simple, reliable and fail-safe. The present invention uses current loops to control electrical devices. Current loops have traditionally used direct current (DC), but this invention also discloses using alternating current (AC) to energize the current loop for certain embodiments. A current loop is advantageous because the current signal is not degraded by the length of wire used to connect equipment together. If a wire or connection becomes broken or fails, the current loop is interrupted and everything connected within the current loop is immediately shut down.

This method of shutdown is particularly well suited in the case of solar PV systems. A solar PV system can include one or more solar PV modules. As used herein, the term solar PV module can refer to one or more solar PV cells for generating or supplying solar electricity. When sunlight hits the surface on a solar PV module it can generate DC voltage greater than 30 Volts and it cannot be turned off. Solar PV modules are usually wired in series, typically generating from 300-1000 Volts. This is known in the industry as a string. Once the individual solar PV modules are connected in a string, the resultant high voltage that occurs everywhere along that string is life-threatening. It is therefore imperative to turn-off all solar PV modules on the same string simultaneously by disabling them. When an isolation transformer and an electronic switch are installed on the back of each solar PV module, and all modules are controlled by the same current loop, this objective of disabling not just the individual modules, but also the whole string is achieved. The shutdown circuitry can be included inside the main solar PV module junction box, or in a separate enclosure. The string can be rapidly de-energized to prevent electrocution and fire hazards along the string and in each module. This method meets the demands of code officials, safety inspectors, installers, service technicians, and firefighters.

In the preferred embodiments, a current source is used to energize the current loop, which in turn energizes isolation transformers, thus allowing the output from the solar modules to become active. If the current source was interrupted by manually throwing a switch or by disconnecting grid power to the building, all solar PV modules connected to the current loop would rapidly and simultaneously shut off. Likewise, if the current loop is interrupted at any point, such as by a fire or fire fighter's hatchet or saw, all the solar PV modules are rapidly and simultaneously shut off rendering them harmless.

In order for a PV system to be totally safe, all conductors carrying high voltage must be isolated or shorted. This includes conductors connected to solar inverters. Solar inverters are required by code to automatically shut down the AC output, but they all contain a bank of capacitors on the DC input terminals which continue to hold a dangerous electric charge for typically up to 3 minutes after the solar PV modules have been shut down. During this time, even if the solar PV modules themselves are shut off, the electric charge on the capacitor bank will continue to make the conductors and associated wiring dangerous to life. The same shutdown method incorporating an isolation transformer connected into the current loop used to control the solar PV modules can also be used to initiate a safe discharge circuit. The discharge circuit will rapidly bleed away the charge on the capacitor bank so that there is less than 30 Volts on the capacitor bank after 30 seconds, and the entire PV system is de-energized and safe.

In certain embodiments, a low melting point wire is used as the wire for the current loop. This wire or conductor can be routed with electrical wiring, constituting a continuous distributed overheat and fire sensing method. If the temperature anywhere along the path of the current loop rises above the melting point of the wire, the wire can melt and open the current loop. As the current loop opens, all solar PV modules and associated equipment controlled by the current loop rapidly shut down. The low melting point wire can be routed through or alongside conduits, junction boxes, combiner boxes and any electrical distribution cable or device. This is easily adapted for the retrofitting of existing systems.

Thermal fuses and smoke alarms are commonly used to sense overheating and fires, but there has never before been a distributed fail-safe method which can sense overheating and fire over a long distance and which can automatically shut down multiple electrical devices without intervention from an operator. This method is effective in sensing overheating and fire throughout PV current loops or anywhere in an electrical system. It can be installed in or along conduits, tunnels, chases and within wall cavities. It is equally effective over short and great distances. The disclosed method has the key advantages of being simple, reliable, low-cost and easy to install. This method is completely passive and fail-safe because no power source is required to initiate a shut down. It is, in fact, the absence of a current which initiates a shutdown.

The foregoing methods and systems can be used separately and in combination, and can be applied to many different types of electrical devices in addition to solar PV modules. When a relay coil is powered by a current loop consisting of low melting point wire, the contacts can be used to automatically shut off electrical devices or electrically-operated equipment in the event of overheat or fire. Using these techniques, current sources, relays and heat-sensing current loops can be connected together to provide rapid shutdown to individual devices or a large system. Relay contacts can also be used, for example, to activate an alarm system or close a valve in a chemical plant.

A key safety feature of these methods and systems is that they do not utilize any integrated circuits or microprocessors and therefore are neither susceptible to radio frequency interference of any kind nor do they emit any RFI. For example, in the event of a building fire, there is no risk of this shutdown method failing to operate because of interference from first responders' wireless communication devices.

Referring now to the figures, FIG. 1 is a schematic of a system 100 utilizing a current loop 110 to control multiple devices 111A according to an embodiment. The system 100 includes a plurality of circuits 111-114 where each circuit includes an electrical device 111A-114A. The electrical device can be a source of electrical power, such as solar photovoltaic module comprising photovoltaic cells, or a generator. An electrical device can also be a device that uses an electrical current to perform a useful purpose of some kind, such as a light bulb, a motor, a power supply, a computer, a radio or an appliance. An electrical device can also be a component such as a relay, a contactor or a transformer.

Each circuit 111 also includes a control circuit (discussed in further detail below) to turn the electrical device on and off. Each control circuit includes an isolation transformer 101-104. The isolation transformer can by any transformer used to transfer electrical power from a source of alternating current (AC) to some equipment or device while isolating the powered device from the power source. Isolation transformers provide galvanic isolation and are used to transfer power between two circuits which must not be electrically connected. Examples of isolation transformers are current transformers and voltage transformers.

In the exemplified embodiment, the isolation transformer is a current transformer. A current transformer is a type of isolation transformer that produces an alternating current in its secondary winding which is proportional to the current in its primary winding. A current transformer is fed with a substantially constant current, unlike a voltage transformer that is fed with a substantially constant voltage. A current transformer typically has a very low primary winding impedance such that it produces a very small voltage drop across the primary winding when the specified current is passed through it. The current transformer 101 can be designed so that the secondary winding provides a suitable voltage into a burden resistor that can then be used to control the electrical devices 111.

The exemplified system 100 further includes an electrical source 106 configured to provide a control current. The electrical source can be, for example, a current source or a voltage source. A current source can be a source of electrical current whereby the current remains substantially constant and the voltage of the source depends on the impedance of the load connected to the current source. By contrast, a voltage source can be a source of electrical current whereby the voltage remains substantially constant and the current drawn depends on the impedance of the load connected to the voltage source. Electrical sources can provide either direct current (DC) or alternating current (AC). In the exemplified embodiment, the electrical source 106 is a current source providing an AC control current.

The system 100 can further include a switching device 105 configured to switch on and off. In the exemplified embodiment, the switching device 105 is a manual switch that can turn off the voltages at the secondary windings of the isolation transformers. Such a switch can include, for example, a lever or pushbutton that a first responder can move to cause the switch to enter an off state (whereby the switch can shut off the electrical devices as described herein). In other embodiments, other types of switches can be used. In yet other embodiments, the switching device 105 can be omitted.

The system 100 further includes conductors 110 configured to connect the isolation transformers 101-104 of the plurality of circuits 111-114, the electrical source 106, and the switching device 105 in series to form a current loop 107, the current loop 107 transmitting the control current. In the exemplified embodiment, the conductors 110 are wires, though other conductors can be used. A key advantage of the current loop is that the accuracy of the signal is not affected, or affected minimally, by the voltage drop in the interconnecting wiring and other devices connected into the loop. Even if there is significant electrical impedance in the wire, the current loop source can maintain the proper current, up to its maximum voltage capability.

The system 100 is configured such that, when the switching device 105 is switched from on to off, the isolation transformers of the plurality of circuits stop receiving the control current, thereby causing the electrical devices of the plurality of circuits to shut off simultaneously. In other embodiments, the transmission of the control current can be stopped by other means, such as by the melting or destruction of the wire 110.

Figure 2:
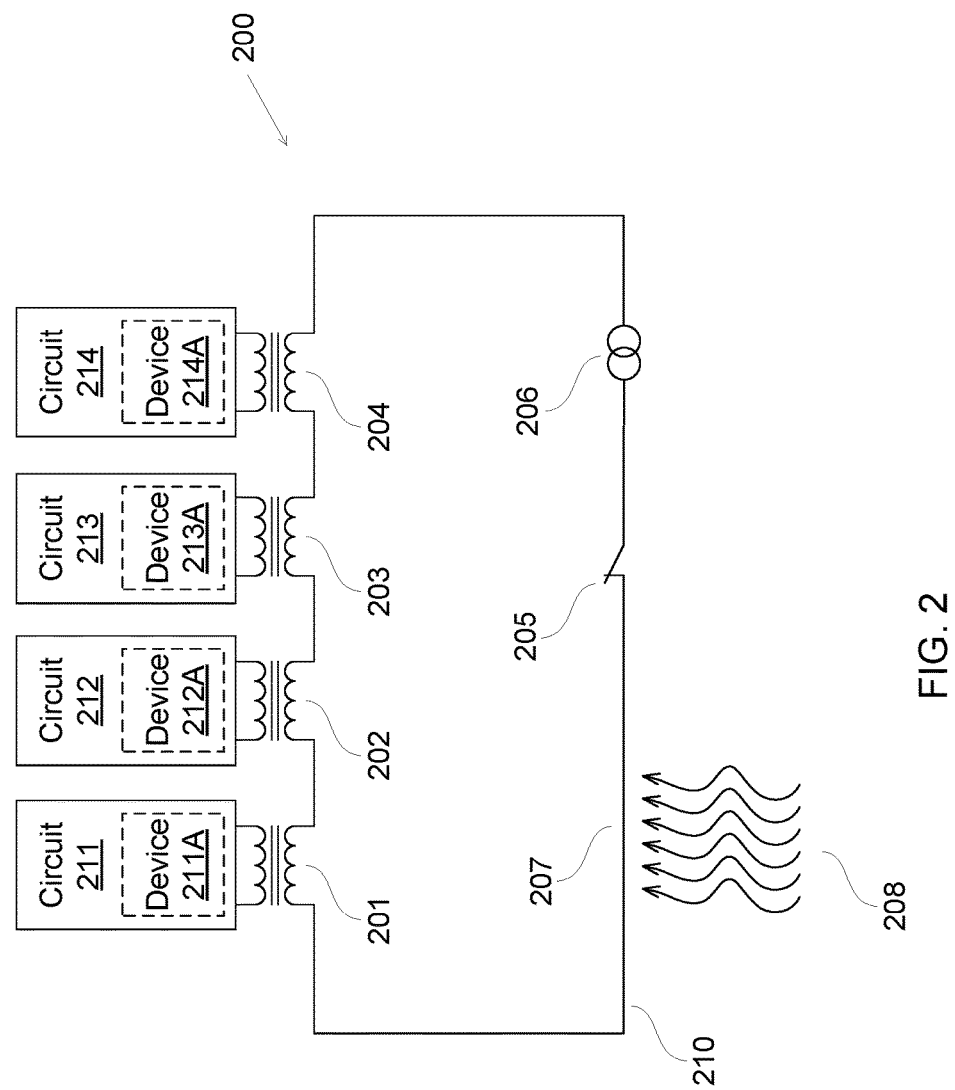
FIG. 2 is a schematic of a system using a current loop utilizing low melting point wire to control multiple devices according to one embodiment.

FIG. 2 is a schematic of a system 200 using a current loop 207 utilizing low melting point wire 210 to control multiple devices 211A-214A according to one embodiment. With the exception of the low melting point wire 210, this embodiment is similar to the system 100. The system 200 includes circuits 211-214 that each include an electrical device 211A-214A and control circuits, the control circuits including isolation transformers 201-204. The system further includes an electrical source 206 and a switching device 205. With regard to these components, the alternative embodiments discussed with regard to system 100 can generally be applied also to system 200.

System 200 differs from system 100 in that the conductors 210 include low melting point wire that melts when overheated. The low melting point wire can form all or part of the conductors 210 that form the current loop 207. When low melting point wire is used to connect the current loop 207, the entire path of the current loop 207 becomes a distributed overheat or fire sensing method. The low melting point wire can be routed to follow power wiring, connections, distribution channels, or other areas that could overheat or catch fire. Where low melting point wire is used to form the entirety of conductors 210, if the temperature anywhere along the current loop 207 rises above the melting point of the wire, the wire can melt and stop the flow of current in the current loop 207. In the exemplified embodiment, this would turn off the voltages at the secondary windings of the isolation transformers 201-204 simultaneously. FIG. 2 shows current transformers 201-204 connected in current loop 207, which is energized by AC current source 206 and includes manual switching device 205. Heat source 208 is shown melting the low-melting point wire 210 of the current loop.

The low melting point wire can be made, for example, of tin or a tin alloy. Tin melts at 231° C. Thus, if tin wire was used to connect the current loop, the wire would melt and open the current loop if the temperature rose above 231° C. anywhere that the wire had been routed. The two metals most commonly used for electrical wiring are copper and aluminum, but their melting points are 1085° C. and 660° C., respectively. These melting points are too high to provide rapid and reliable indication of or a small fire or an abnormal rise in temperature. In other embodiments, the low melting point wire can be made of any conductor that melts at a temperature below 300° C. or 400° C.

Figure 3:
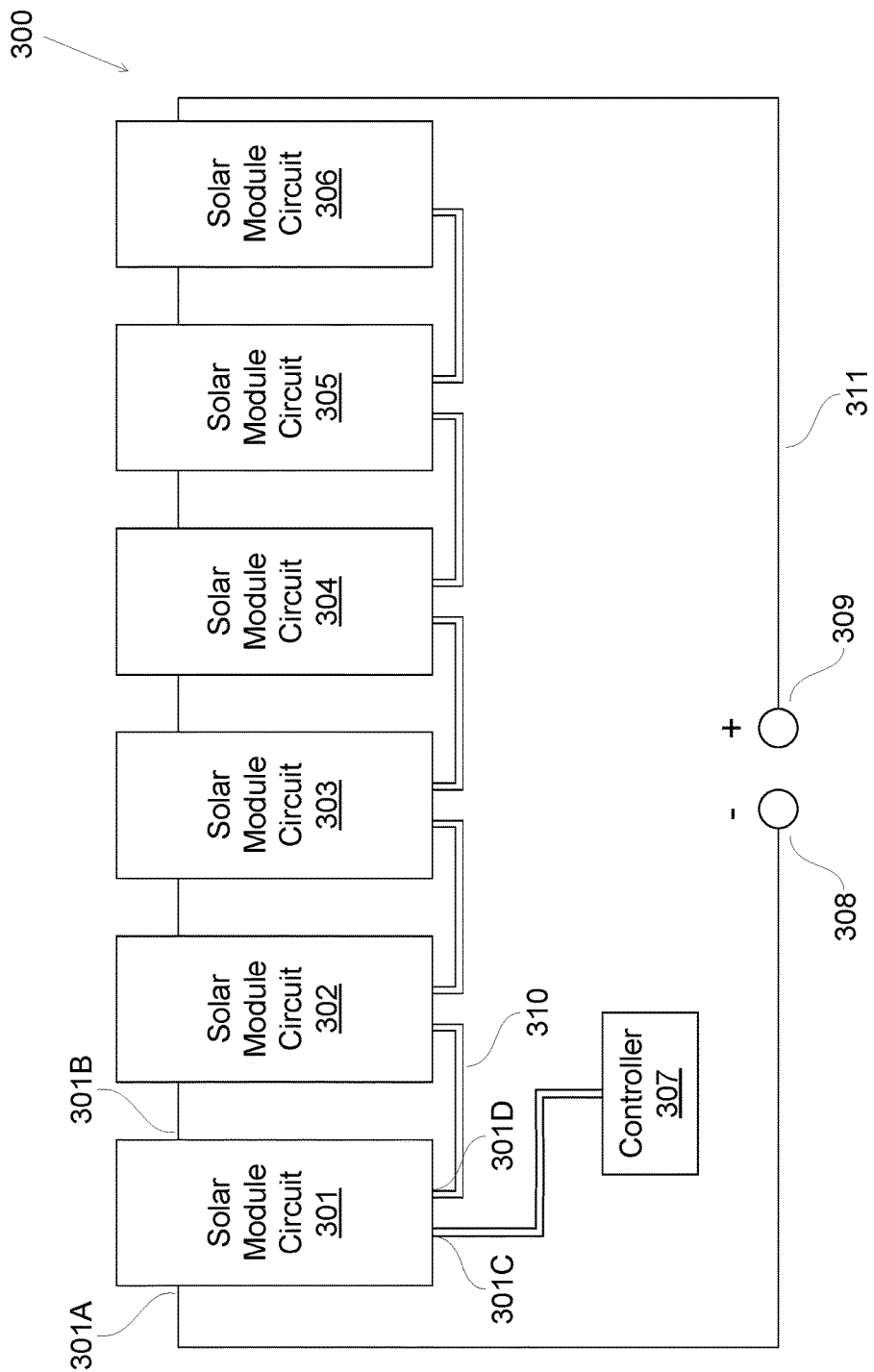
FIG. 3 is a schematic of a system including a string of solar modules controlled by a controller.
Figure 4:
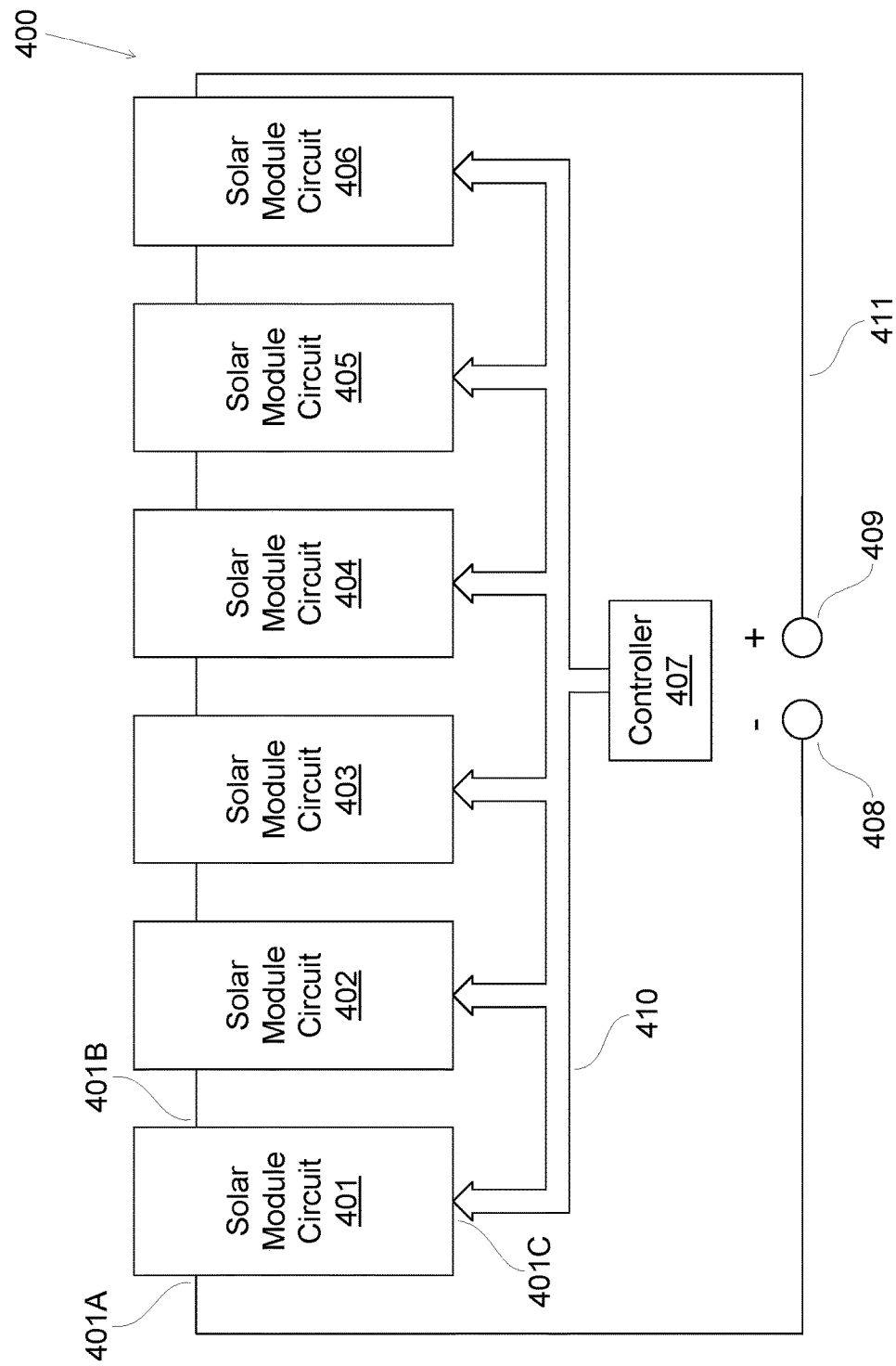
FIG. 4 is a schematic of a system including a string of solar modules controlled by a controller using a bus or a network according to one embodiment.

FIGS. 3 and 4 show an alternative to using a current loop to control an electrical device. FIG. 3 is a schematic of a system 300 including a string of solar module circuits 301 controlled by a controller 307. The control connections 310 of the controller are daisy-chained from one solar module circuit to the next. Solar module circuits 301-306 are turned off and on by controller 307 via control connections 310 and module control terminals 301C, 301D. The module output terminals 301A, 301B are connected in series to the string output terminals 308, 309 by high-voltage conductors 311. The disadvantage of this type of control technique is that, if the control cable breaks between solar module circuits 301-306, the control signal reaches some solar module circuits, but not all of them. So some modules in a string could be de-energized while others remain energized. Thus, in the case of a fire, some solar module circuits might still be energized if the control connections 310 are damaged. If a shutdown signal is required in order to de-energize the modules of the solar module circuits 301-306, that signal may not reach all of the modules and some would remain energized allowing life-threatening voltages to remain on the wiring.

FIG. 4 is a schematic of a system 400 including a string of solar module circuits 401-406 controlled by a controller 407 using a bus or a network 410 according to one embodiment. FIG. 4 is similar to FIG. 3. The module output terminals 401A, 401B are connected in series to the string output terminals 408 and 409 by high-voltage conductors 411. In this embodiment, however, the controller 407 and the solar module circuits 401-406 communicate via a bus or link 410 (operably coupled to control terminal 401C) instead of daisy-chained wiring. The bus or link 520 could be wired or wireless, as in Wi-Fi, but the disadvantages are the similar to those discussed above with regard to FIG. 3.

Figure 5:
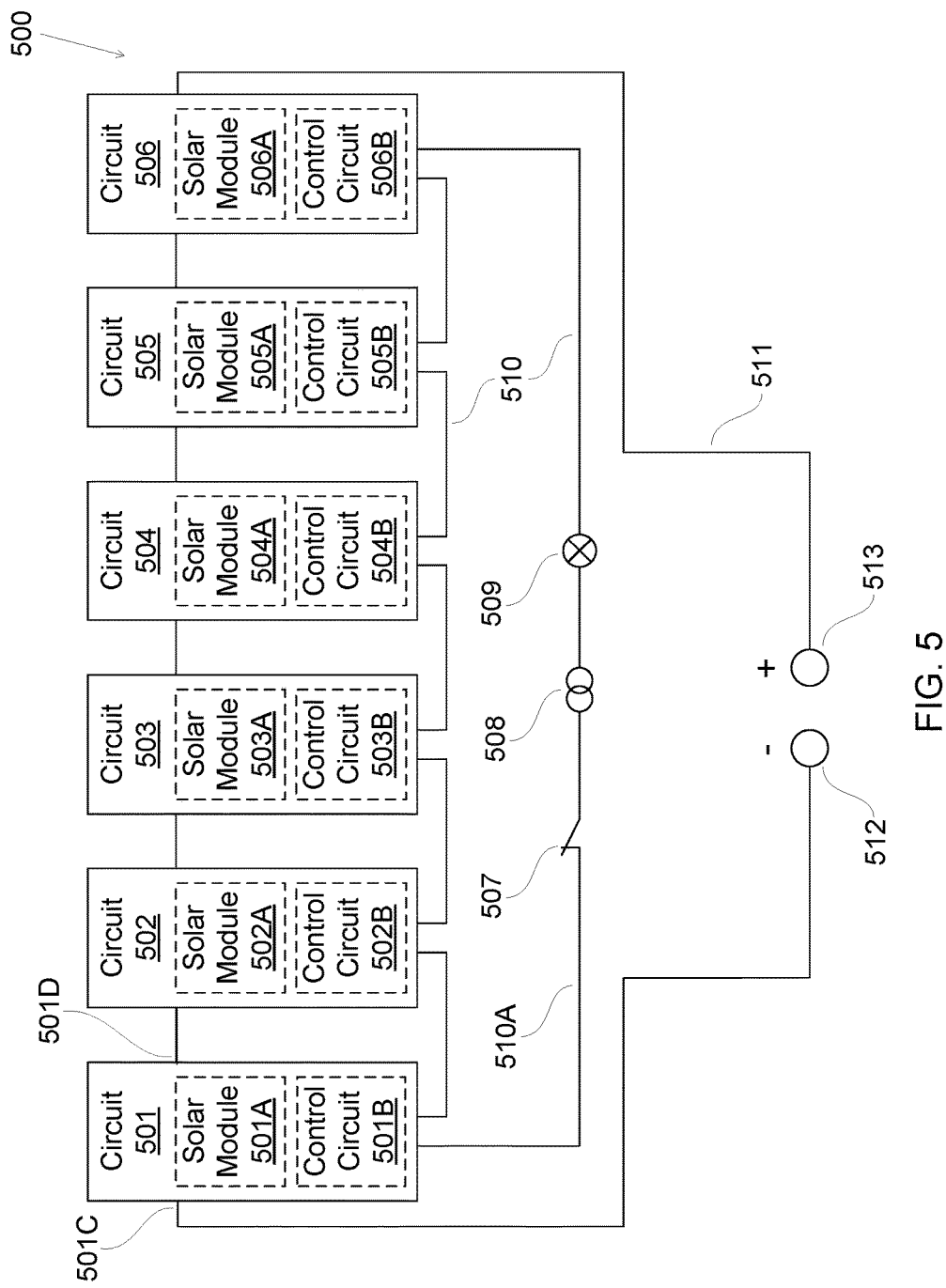
FIG. 5 is a schematic of a system including a string of solar modules controlled by a current loop according to one embodiment.

FIG. 5 is a schematic of a system 500 including a string of solar module circuits 501-506 controlled by a current loop 510 according to one embodiment. The current loop 510 comprises a conductor 510A. Each circuit 501-506 comprises a solar PV module 501A-506A and a control circuit 501B-506B. A single solar PV module can be controlled by the current loop 510, or many can be controlled by the same current loop 510. The maximum number which could be controlled by a single current loop would be determined by the maximum voltage of the current source 508 and the cumulative voltage drop of the isolation transformers or current transformers inside each solar PV module. In general practice, it is desirable to keep control voltages below 30 Volts DC or 15 Volts AC so that there is no risk of shock even in wet conditions. Even with a maximum voltage of only 15 Volts AC, it is still practical to connect over a 100 solar PV module control circuits in series.

The system 500 can include a status indicator 509 to show when the current loop 510 is energized by the current source 508 (or other electrical source), and a switch 507 to allow the current loop and the solar PV modules 501A-506A to be manually shut down. In this embodiment, the module output terminals 501C, 501D are connected to the string output terminals 512, 513 by high-voltage conductors 511. Detailed embodiments of the control circuit 501B of the solar PV modules are disclosed later in this description. In other embodiments, the solar PV modules can be replaced with another electrical device.

System 500 has the advantage that all the solar PV modules 501A-506A are synchronously energized and de-energized. That is, all modules 501A-506A are turned on and turned off together. There can never be an instance of one or more modules being energized while some are de-energized. This is because the same current loop 510 is controlling all the modules 501A-506A. If the loop 510 breaks anywhere, including even the primary winding of one of the isolation transformers inside a module, the energizing current ceases to flow along the loop 510 and all modules 501A-506A are rapidly shut down. This is important because the outputs 501C, 501D of the solar PV modules are wired in series, so the control wires should also be connected in series. This control system is inherently fail-safe.

When the current loop 510 is connected using low melting point wire, an additional level of protection and shutdown is achieved. If the wire forming the current loop 510 was routed along with the main system wiring then, if there was overheating of any kind, whether due to a bad crimp on a high-voltage cable or a fire within the building on which the solar PV modules were mounted, a portion of the control wire would melt and stop current flowing in the loop. This would rapidly and simultaneously shut down all solar PV modules in the string.

In a preferred embodiment, a manual safety disconnect switch 507 would be included in the current loop to manually shut down the solar PV modules or perform functional verification. It is useful to include a status indicator 509 in the current loop 510 to indicate the status of the control loop. If a status indicator is chosen so that it operates at the same current as is flowing in the current loop 510 it will reliably indicate that the current loop 510 is energized and intact, and that the control signal is flowing to every solar PV module 501A-506A connected to the current loop 510.

Figure 6:
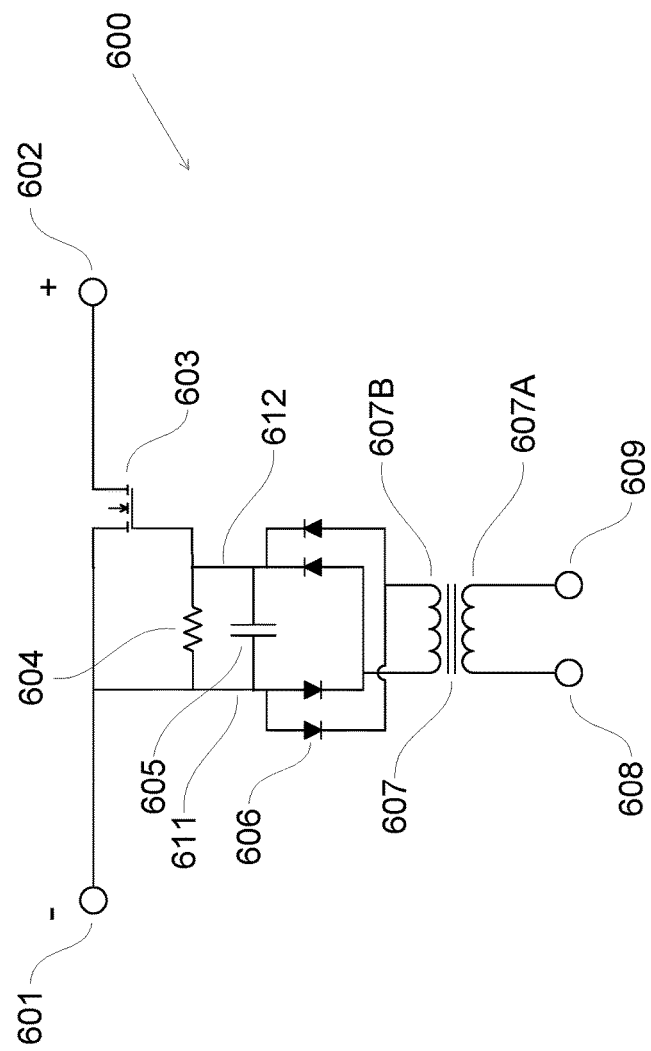
FIG. 6 is a schematic of a control circuit utilizing an isolation transformer and a field-effect transistor according to one embodiment.

FIG. 6 is a schematic of a control circuit 600 utilizing an isolation transformer 607 and a field-effect transistor 603 for controlling an electrical device according to one embodiment. In the exemplified embodiment, the isolation transformer 607 is a current transformer. The current transformer 607 is designed to provide an AC voltage at the secondary winding 607B suitable for turning on Metal Oxide Semiconductor Field Effect Transistor (MOSFET) 603 when the specified current flows through the transformer 607 primary winding 607A. A practical example would be a transformer 607 designed to produce 8 volts RMS into a 100 KOhms resistor 604 when 50 mA RMS was passed through the primary winding 607A via control terminals 608, 609.

Further, the control circuit 600 comprises a MOSFET 603 operably coupled to the current transformer 607 and the electrical device (such as the solar module 501A-506A of FIG. 5), the MOSFET 603 having an on state and an off state. When the current transformer 607 stops receiving the control current, the MOSFET 603 switches to the off state, thereby shutting off the electrical device. The control circuit has a first output terminal 601 and a second output terminal 602.

The exemplified control circuit 600 further comprises a diode bridge 606 operably coupled between the current transformer 607 and the MOSFET 603, the diode bridge 606 configured to rectify a secondary current from a secondary winding 607B of the current transformer 607. In this embodiment, the secondary current is an AC current.

The exemplified control circuit 600 further comprises a smoothing capacitor 605 configured to (a) receive the rectified secondary current and (b) provide a DC voltage to the MOSFET 603 to turn on the MOSFET 603. In the exemplified embodiment, the smoothing capacitor 605 provides a steady DC voltage of approximately 8 volts to turn on MOSFET 603. A typical turn-on voltage for many MOSFETs is 4-5 volts, so this example provides a reliable turn-on voltage. MOSFETs typically have very high gate impedances, so very little energy is required to turn them on and off. This provides a key advantage for this method of control: many such circuits can be controlled by a single current loop using only 50-100 mA of current and a limiting voltage of 15 volts AC which presents zero risk of shock. This compares favorably to approaches using relays and contactors to shut down solar PV modules. Energizing many relay or contactor coils to keep a large number of solar PV modules energized in a big system would require many Watts of power.

The exemplified control circuit 600 further comprises a resistor 604 configured to (a) convert the secondary current to the desired voltage and (b) discharge voltage on the smoothing capacitor 605 when the control current in a primary winding 607A of the current transformer 607 is turned off. This helps ensure that MOSFET 603 will rapidly and completely turn off when the transformer is not energized.

In the exemplified embodiment, the resistor 604 and the smoothing capacitor 605 are connected in parallel. Further, each of the smoothing capacitor 605 and the resistor 604 can be connected (a) at a first terminal 611 to a first electrical device terminal (via a first output terminal 601) and (b) at a second terminal 612 to a gate of the MOSFET 603.

The MOSFET 603 can be used to turn a multiplicity of electrical devices on off, and those skilled in the art of electronic design will know how to interface the negative terminal 601 and positive terminal 602 to any manner of electrical devices and equipment to enact on/off control of such equipment. A simple example would be to use the MOSFET to turn a relay or contactor on and off. The relay or contactor could then be used to turn on and off any electrical equipment which is within the ratings of the contacts.

Figure 7:
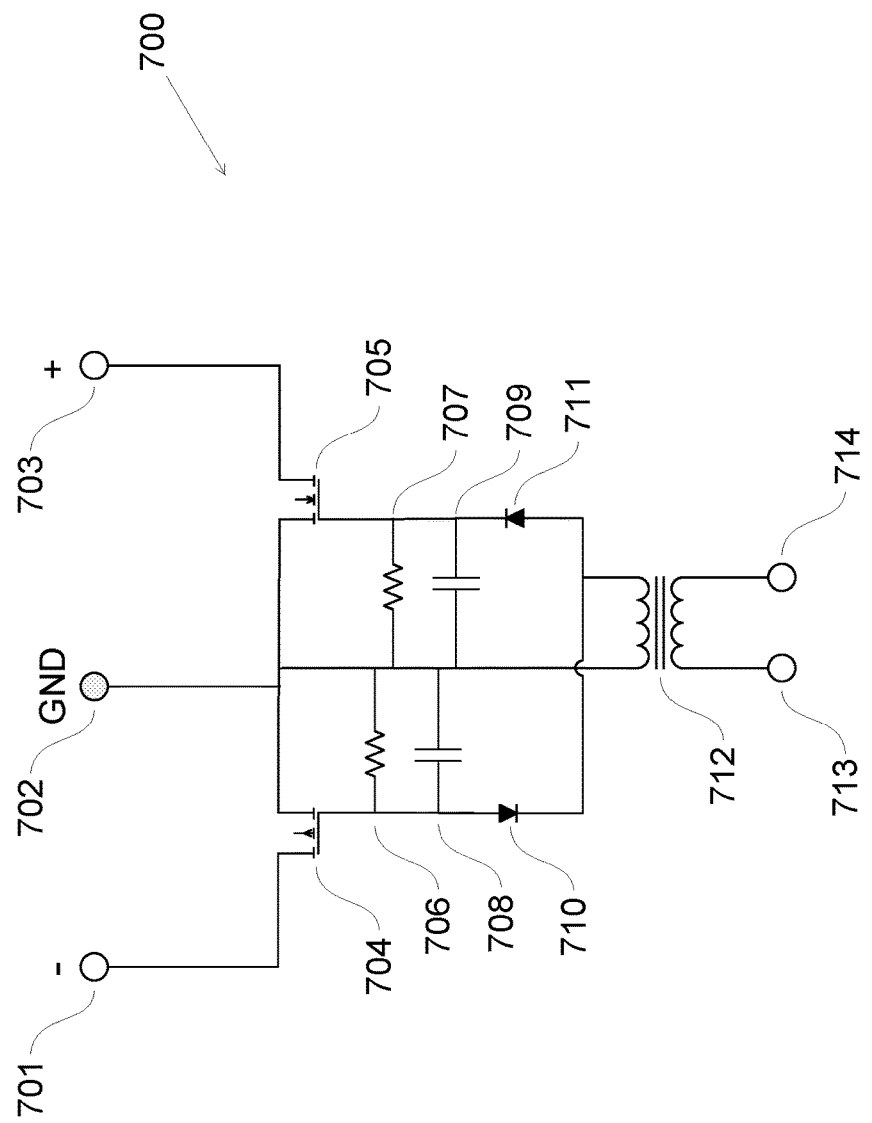
FIG. 7 is a schematic of a control circuit utilizing an isolation transformer simultaneously controlling a P-channel MOSFET and a N-channel MOSFET according to one embodiment.

FIG. 7 is a schematic of a control circuit 700 utilizing an isolation transformer 712 simultaneously controlling a P-channel MOSFET 704 and a N-channel MOSFET 705 according to one embodiment. In this embodiment, the isolation transformer 712 is a current transformer. The control circuit 700 includes the current transformer 712 and associated circuitry configured to simultaneously control both the N-Channel MOSFET 705 and the P-Channel MOSFET 704 when an AC current is applied to the control terminals 713, 714. This allows control of both positive voltages (through the N-Channel MOSFET 705) and negative voltages (through the P-Channel MOSFET 704). The diode bridge 606 of FIG. 6 has been replaced by diodes 710 and 711 configured as a voltage doubler. This produces both a positive and a negative voltage suitable for controlling the two MOSFETs 704, 705. Smoothing capacitors 708, 709 provide a steady DC voltage to turn on the MOSFETs 704, 705. Resistors 706, 707 act as burden resistors for current transformer 712 and also bleed away the charge on capacitors 708, 709 when the energizing current at the control terminals 713, 714 is turned off. Those skilled in the art of electronic design will see applications for simultaneously controlling positive and negative voltages by connecting the ground terminal 702, the negative terminal 701, and the positive terminal 703 to a multitude of electrical and electronic devices.

Figure 8:
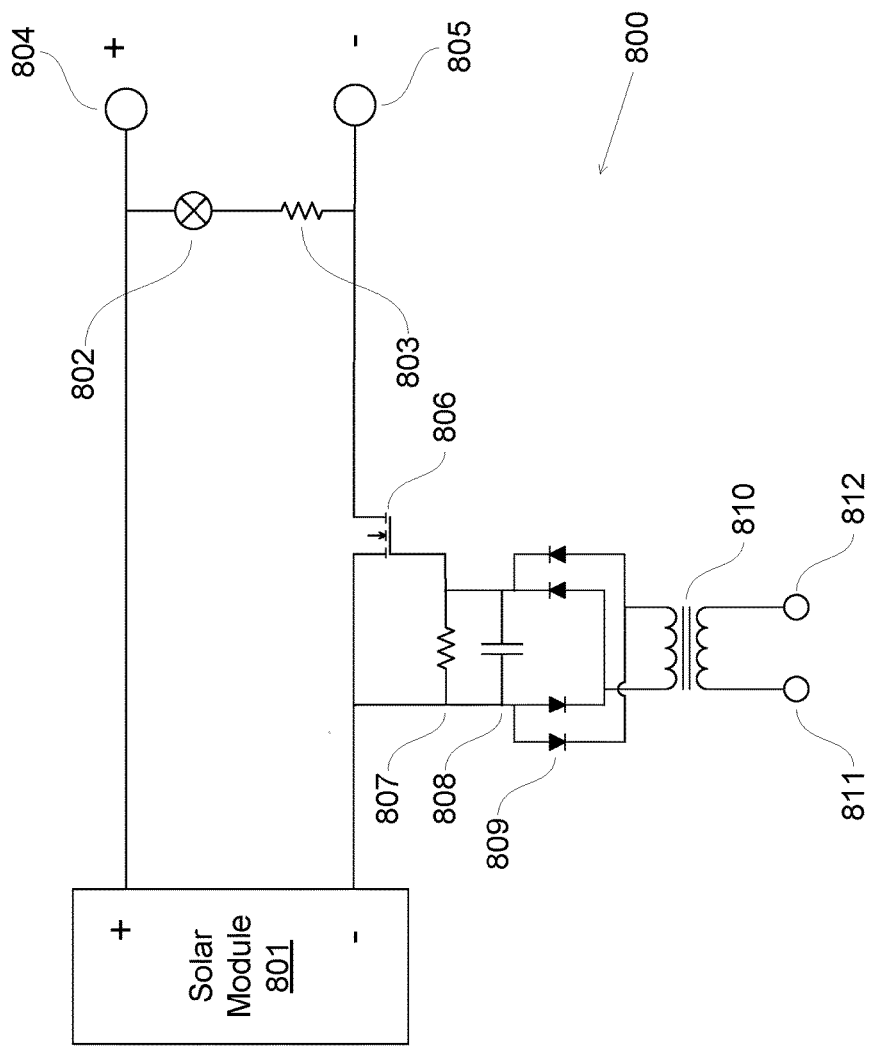
FIG. 8 is a schematic of a solar module circuit utilizing an isolation transformer and a MOSFET to shut off a solar module according to one embodiment.

FIG. 8 is a schematic of a solar module circuit 800 utilizing an isolation transformer 810 and an enhancement mode MOSFET to shut off a solar module according to one embodiment. FIG. 8 shows the control circuit 600 of FIG. 6 incorporated into a solar PV module 801 to control the module output. The enhancement mode MOSFET 806 is operably coupled to the current transformer 810 and the solar module 801. The current transformer 810, by the nature of its design, provides electrical isolation between the control terminals 811, 812, and the module output terminals 804, 805. This helps promote safety (and meet electrical code) and provide practical benefits. Diode bridge 809 rectifies the AC current from the secondary winding of current transformer 810 to produce DC current which is smoothed by capacitor 808. The resulting voltage turns MOSFET 806 on, thus allowing the current from the solar cells of solar module 801 to flow to the module output terminals 804, 805. Resistor 807 acts as the burden resistor for current transformer 810 and also bleeds away the charge on capacitor 808 when the signal at the control terminals 811, 812 is turned off. Status indicator 802 and resistor 803 allow maintenance personnel to see when the module output is energized. These two components also drain away the minute leakage current through MOSFET 806 when it is turned off.

When a plurality of solar PV modules such as module 801 are connected together in a string as shown in FIG. 5, the outputs of all the solar PV modules can then be synchronously controlled by a simple current loop using very little energy. This is an ideal method of providing rapid shutdown. This method has the additional benefits of not requiring a complex signal or instruction of any kind, nor does it require a power supply, a backup energy source, or a battery within the solar PV module itself to facilitate a shutdown. The absence of a control signal means the modules are immediately shut down. The default, zero-energy state is off. It is therefore fail-safe.

Figure 9:
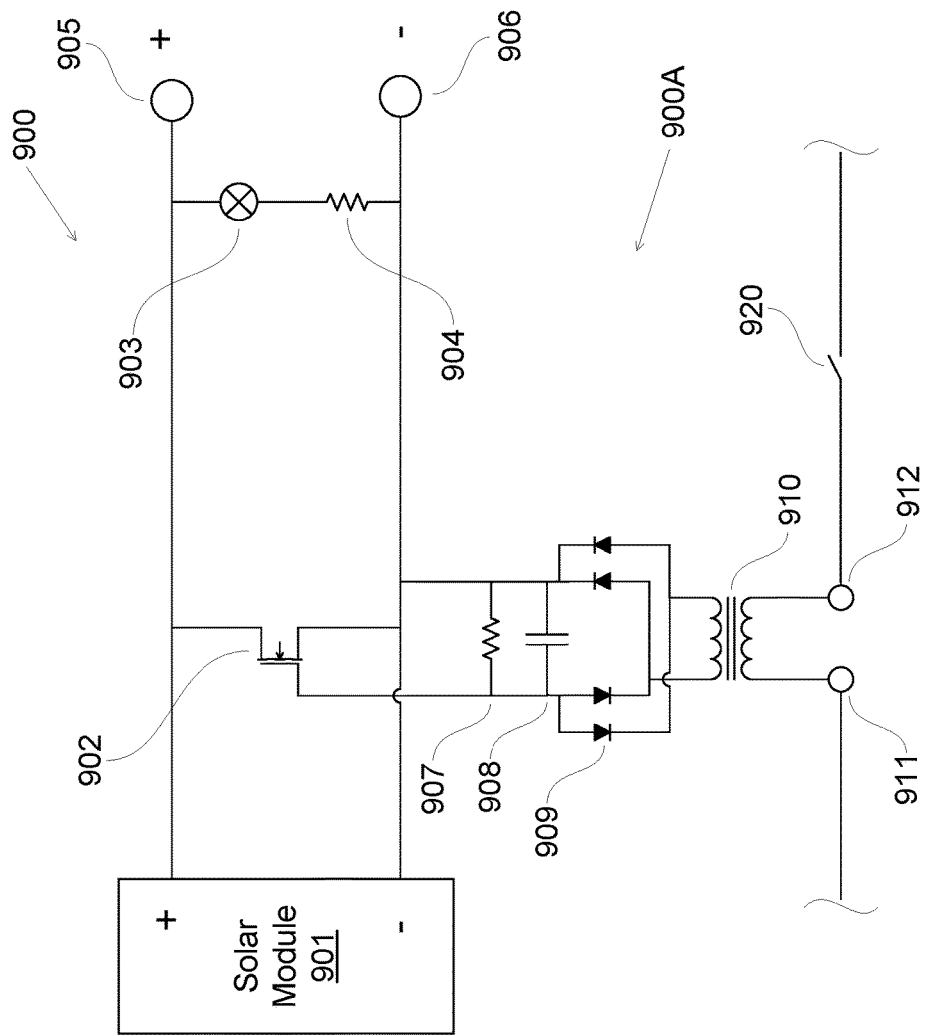
FIG. 9 is a schematic of a solar module circuit utilizing an isolation transformer and a depletion-mode MOSFET to short solar cells according to one embodiment.

FIG. 9 is a schematic of a solar module circuit 900 utilizing a depletion mode MOSFET 902 to short solar cells of a solar PV module according to one embodiment. In the exemplified embodiment, the isolation transformer 910 is a current transformer. The solar photovoltaic module 901 comprises photovoltaic cells. The control circuit 900A is configured to turn the solar photovoltaic module on and off, the control circuit 900A comprising the depletion mode MOSFET 902, which is operably coupled to the solar photovoltaic module 901 and to a switching device 920, the depletion mode MOSFET 902 having an on state and an off state. When the current transformer 910 stops receiving the control current (e.g., upon the switching device switching from a first (on) state to a second (off) state, the depletion mode MOSFET 902 switches to the on state to short the photovoltaic cells of the solar module 901, thereby shutting off the solar module 901. In the exemplified embodiment, the isolation transformer 910 is configured to receive a control current, and when the switching device 920 switches from the first (on) state to the second (off) state, the isolation transformer 910 stops receiving the control current, causing the depletion mode MOSFET 902 to switch to the on state.

FIG. 9 is an alternative approach to FIG. 8. Instead of using enhancement-mode MOSFET 806 of FIG. 8 to make the solar PV module safe by disconnecting the solar cells from the module output, depletion-mode MOSFET 902 is used to short the output of solar PV module 901. A depletion-mode MOSFET is ideal for this purpose because the default state is normally-on. Thus, no power, voltage, or signal of any kind is required to turn MOSFET 902 on and make the module safe. From that point of view, therefore, this method is fail-safe. A negative voltage (typically 4-5 volts) is required to turn off a typical depletion-mode MOSFET and that is generated by current transformer 910 and associated components 907, 908, 909, as described for components 807, 808, 809, in FIG. 8. In this application, however, the positive voltage is connected to the source terminal of the MOSFET and the negative voltage to the gate terminal. Depletion mode MOSFETs have not been used before to short solar PV cells to make a solar PV module safe. This is likely due in part to the need for a negative gate voltage. But in the present invention, this negative gate voltage is simply and easily achieved.

Similar to earlier embodiments, the solar module circuit includes an optional status indicator 903 and a resistor 904 to allow maintenance personnel to see when the module output is energized. Further, the circuit has output terminal 905, 906 and control terminals 911, 912.

Figure 10:
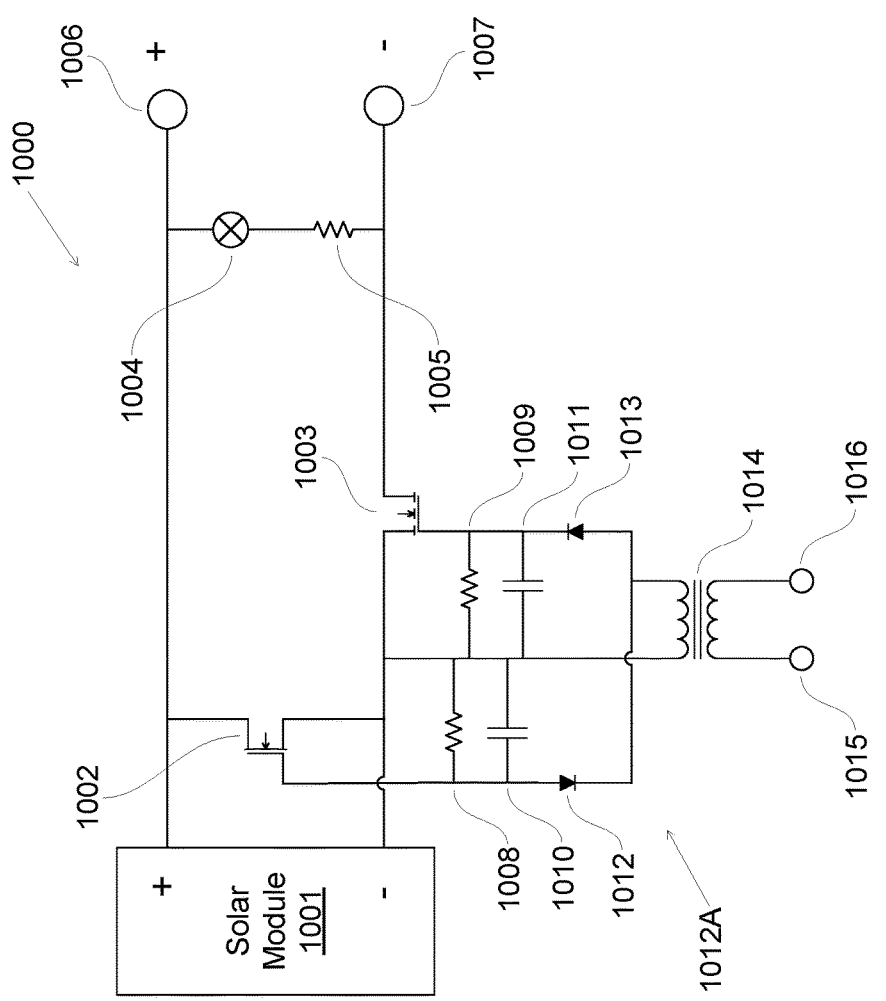
FIG. 10 is a schematic of a solar module circuit utilizing an isolation transformer, an enhancement-mode MOSFET, and a depletion-mode MOSFET to short solar cells according to one embodiment.

FIG. 10 is a schematic of a solar module circuit 1000 utilizing a current transformer 1014, an enhancement-mode MOSFET 1003 coupled to the current transformer 1014 and a solar module 1001 to shut off a solar module output, and a depletion-mode MOSFET 1002 operably coupled to the current transformer 1014 and the solar module 1001 to short solar cells of a solar module 1001 according to one embodiment. The solar module circuit 1000 further comprises a voltage doubler 1012A operably coupled to the enhancement mode MOSFET 1003 and the depletion mode MOSFET 1002.

FIG. 10 combines features of FIGS. 8 and 9. Module-level rapid shutdown is being demanded by first responders for life-safety reasons and, therefore, any such system should have redundancy and should be designed to be as fail-safe as possible. FIGS. 8 and 9 are simple and effective, but rely on a single MOSFET to disable the output of the solar PV module. In FIG. 10, depletion-mode MOSFET 1002 shorts out the PV cells of the solar module while enhancement-mode MOSFET 1003 simultaneously disconnects the module output. Optional status indicator 1004 and dropping resistor 1005 provide a visual indication to maintenance personnel when the module is energized. These two components also drain away the minute leakage current through MOSFET 1003 when it is turned off.

The isolation transformer 1014 in this embodiment is a current transformer which has its primary winding connected into a current loop by control terminals 1015 and 1016. FIG. 5 shows an example where six solar module circuits 501-506 are connected into a current loop. FIG. 10 is an embodiment of a one of those six solar module circuits. In a practical example, the secondary winding is designed to produce approximately 8 volts RMS into 100 KOhms when the current loop is energized. This is suitable to control a typical MOSFET with a gate threshold of 4-5 volts. Rectifier diodes 1012, 1013 and capacitors 1010, 1011 function as a voltage doubler 1012A which simultaneously produces a positive and a negative DC voltage. The positive voltage is used to control enhancement-mode MOSFET 1003 and the negative voltage is used to control depletion-mode MOSFET 1002. Resistors 1008, 1009 serve two purposes: they act as burden resistors for the current transformer 1014 converting the secondary current into the desired voltage, and also bleed away the voltage on the smoothing capacitors 1010, 1011 when the energizing current in the current transformer 1014 primary winding is turned off, that is, when the current loop is turned off. This ensures that enhancement-mode MOSFET 1003 will rapidly and completely turn off and depletion-mode MOSFET 1002 will rapidly and completely turn on when current transformer 1014 is not energized.

Thus, when the control signal is present at the current transformer 1014 primary winding, enhancement-mode MOSFET 1003 will be turned on and depletion-mode MOSFET 1002 will be turned off. The output of solar module 1001 will therefore be allowed to pass to module output terminals 1006 and 1007. When the control signal is absent, enhancement-mode MOSFET 1003 will be turned off and depletion-mode MOSFET 1002 will be turned on. This will prevent the output of solar cells from passing to module output terminals 1006, 1007 by, not one, but two mechanisms: depletion-mode MOSFET 1002 will short the output of the solar cells 1001, and enhancement-mode MOSFET 1003 will disconnect solar cells of solar module 1001 from the module output terminals 1006, 1007. The time constants of the capacitors 1010, 1011 and resistors 1008, 1009 can be chosen by those skilled in the art of electronic design to ensure that enhancement-mode MOSFET 1003 turns off slightly before depletion-mode MOSFET 1002 turns on. In this way, the output of the solar PV module will be disconnected before a short is placed across the solar cells. This would prevent a short appearing across the DC conductors or across the input of an inverter connected to the solar PV modules.

This circuit has the added benefit that the solar cells are shorted by a depletion-mode MOSFET whenever there is no control signal and, therefore, they never operate in open-circuit mode which can degrade the solar cells. This is preferred by some manufacturers.

Figure 11:
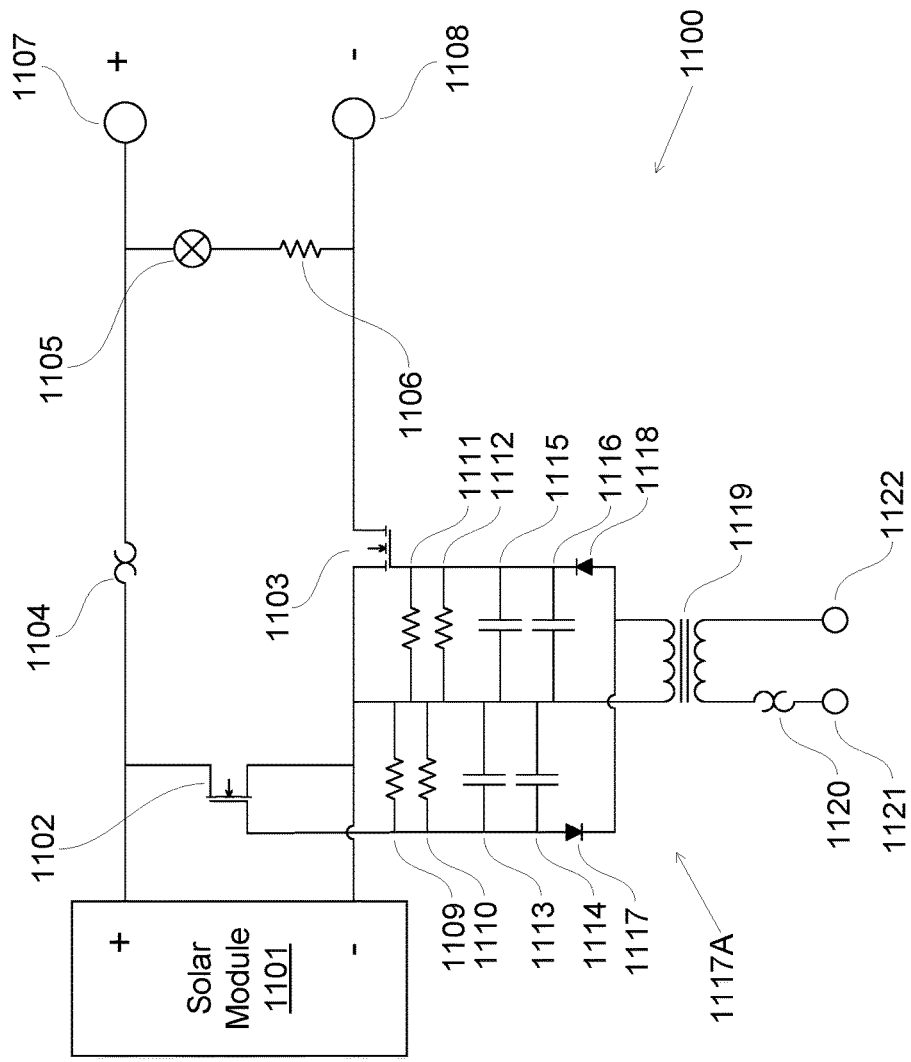
FIG. 11 is a schematic of a solar module circuit utilizing an isolation transformer, an enhancement-mode MOSFET, a depletion-mode MOSFET, and thermal fuses

FIG. 11 is a schematic of a solar module circuit 1100 utilizing an isolation transformer 1119, an enhancement-mode MOSFET 1103, a depletion-mode MOSFET 1102, and thermal fuses 1120, 1104. FIG. 11 is similar to FIG. 10 and provides rapid solar PV module shutdown which is fail-safe and does not rely on one single component. Instead of single bleed resistors 1008, 1009 on each half of the voltage doubler circuit as in FIG. 10, resistors 1109, 1110 in parallel and 1111, 1112 in parallel provide redundancy should one of them fail open-circuit. In FIG. 10, in the very unlikely event that one of the single bleed resistors 1009, 1008 were to fail open circuit, MOSFET 1002 and 1003 gate voltages would not rapidly decay to zero volts and place the module 1101 into the safe state. In FIG. 11, if any one resistors 1009, 1010, 1011, 1012 were to fail open-circuit the other parallel resistor would ensure the gate voltage rapidly dropped to zero. If any resistor 1009, 1010, 1011, 1012 failed short-circuit, the gate voltage would be zero thus placing the module in the safe state.

Similarly, there are two smoothing capacitors 1113, 1114 in parallel on one side of the voltage doubler 1117A (the voltage doubler 1117A comprising diodes 1117, 1118) and two smoothing capacitors 1115, 1116 on the other side so that if one of either pair should fail open-circuit the other will provide the required functionality. If one or both capacitors failed short-circuit, the gate voltage would be zero thus placing the module in the safe state.

Control terminals 1121, 1122 are intended to be connected to the current loop as per FIG. 5 so that the current passes through the current transformer 1119 primary winding. The resulting voltage on the secondary winding powers the voltage doubler 1117A already described. Optional status indicator 1105 and dropping resistor 1106 provide a visual indication to maintenance personnel when the module is energized. These two components also drain away the minute leakage current through MOSFET 1103 when it is turned off.

Two thermal fuses 1104 and 1120 are included in this embodiment to provide additional shutdown capability and redundancy in the event of a fire or overheating in close proximity to the solar PV module 1101. Semiconductors are generally specified to function up to 150° C. and, for short periods of time, up to 200° C., but solder typically begins to soften and melt around 200° C. So it is reasonable to assume that any electronic rapid shutdown method could not be guaranteed to function around or above 200° C. Thus, choosing thermal fuses that break the circuit at around 200° C. would be a reasonable choice. The actual fuse temperature chosen for the thermal fuses, however, can be determined by the manufacturer. In this example, when the temperature of the circuitry exceeded 200° C., both thermal fuses 1104,1120 would break. Thermal fuse 1120 would break the current loop that is controlling all the solar PV modules in the string, as shown in the example of FIG. 5. This would have the effect of rapidly shutting down all the other modules on the string which are controlled by the same current loop. Thermal fuse 1104 is included to ensure continued shutdown in the event that the MOSFETs 1102, 1103 or associated circuitry are compromised by fire or overheating in such a way that they would no longer provide secure module shutdown. When thermal fuse 1104 breaks, then the flow of current from solar cells of the solar module 1101 to the module output terminals 1107, 1108 is permanently disconnected and disabled.

In a practical situation, different temperatures can be chosen for the two thermal fuses. For example, thermal fuse 1120 can use 160° C. and thermal fuse 1104 can use 200° C. In this example, all modules in the string would then be simultaneously shut off if the circuitry at the rear of any one solar PV module exceeded 160° C. and, if the temperature rose above 200° C., then the modules exposed to the higher temperature would be made permanently safe by thermal fuse 1104 even if the shutdown circuitry were to fail.

Figure 12:
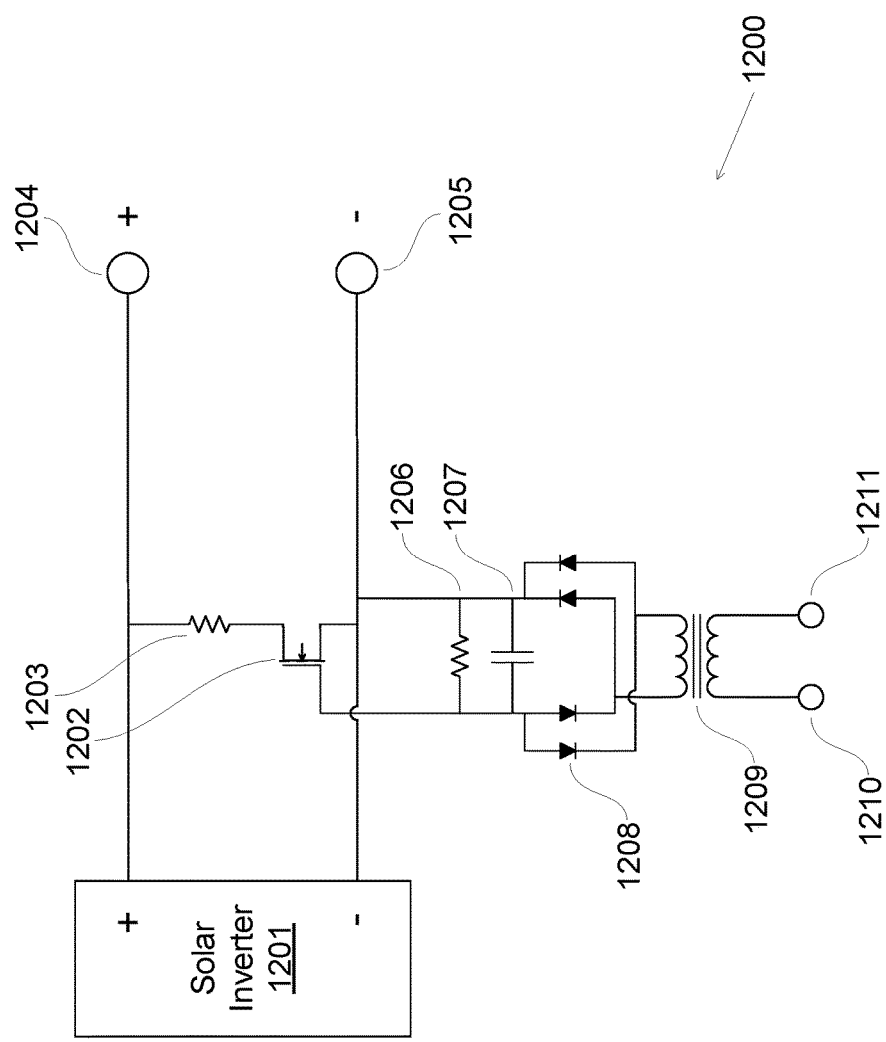
FIG. 12 is a schematic of a solar inverter circuit utilizing an isolation transformer and a depletion-mode MOSFET to safely discharge the capacitor bank in a solar inverter according to one embodiment.

FIG. 12 is a schematic of a solar inverter circuit 1200 utilizing an isolation transformer 1209 and a depletion-mode MOSFET 1202 to safely discharge the capacitor bank in a solar inverter according to one embodiment. The same general methods and systems discussed above used to safely shut down solar PV modules can also be used to safely discharge the capacitor bank inside a solar inverter. All solar inverters have a large capacitor bank internally which is directly connected to the DC solar PV input terminals. Even if the solar PV modules connected to the inverter input terminals are shut off, the inverter capacitors can hold a dangerous electric charge for typically up to 3 minutes. In order to make the whole solar PV system safe in a rapid shutdown situation, the capacitor bank needs to be rapidly discharged.

FIG. 12 shows inverter 1201 which includes a capacitor bank and the input terminals 1204, 1205 to which a string of solar PV modules would normally be connected. Depletion-mode MOSFET 1202 and discharge resistor 1203 are connected across the input terminals 1204, 1205. A depletion-mode MOSFET 1202 is turned on (shorted) when there is zero gate voltage (the default state), and is turned off (high impedance) when there is a negative DC voltage on the gate of more than 4 to 5 Volts. In this way, MOSFET 1202 allows current to pass through discharge resistor 1203 and rapidly discharge the capacitor bank when there is zero voltage on its gate terminal. For a medium-size solar inverter the capacitor bank might be on the order of 2 milliFarads. In such an example, a 1000 Ohm resistor would discharge the capacitor bank from 600 Volts to lower than 30 Volts in less than 10 seconds, easily meeting the 30 Volt and 30 second code requirement. To perform a rapid discharge of this kind, however, necessitates dissipating significant energy in a short time. In the example using a 2 mF capacitor bank charged to 600 Volts, the energy would be 360 Joules. In a practical application, consideration must be given to the resistor, or resistors, chosen for this task. However, resistors capable of handling such voltages and energies are available, some of the most suitable being bulk resistors which have very large surge energy capabilities.

In this embodiment, the negative gate voltage necessary to keep MOSFET 1202 turned off is provided by current transformer 1209 and associated electronic components. Current transformer 1209 is connected via control terminals 1210 and 1211 into the current loop which is controlling the solar PV modules (as shown in FIG. 5). When an AC current is flowing in the current loop, current flows in the transformer 1209 primary winding and a voltage is generated in the secondary winding. This AC voltage is rectified by diode bridge 1208 and the resulting DC voltage is smoothed by capacitor 1207. Resistor 1206 acts as the burden resistor for current transformer 1209 and also bleeds away the charge on capacitor 1207 when the signal at the control terminals 1210 and 1211 is turned off.

In normal operation, the current loop would be energized and MOSFET 1202 would be turned off by the negative gate voltage present on capacitor 1207. This would allow the solar inverter 1201 and solar PV system to function normally. When it was necessary to shut down the solar PV system the current loop would no longer be energized which would mean that there was no longer a negative voltage on the gate of MOSFET 1202 and it would turn on thus rapidly discharging the inverter capacitor bank.

Figure 13:
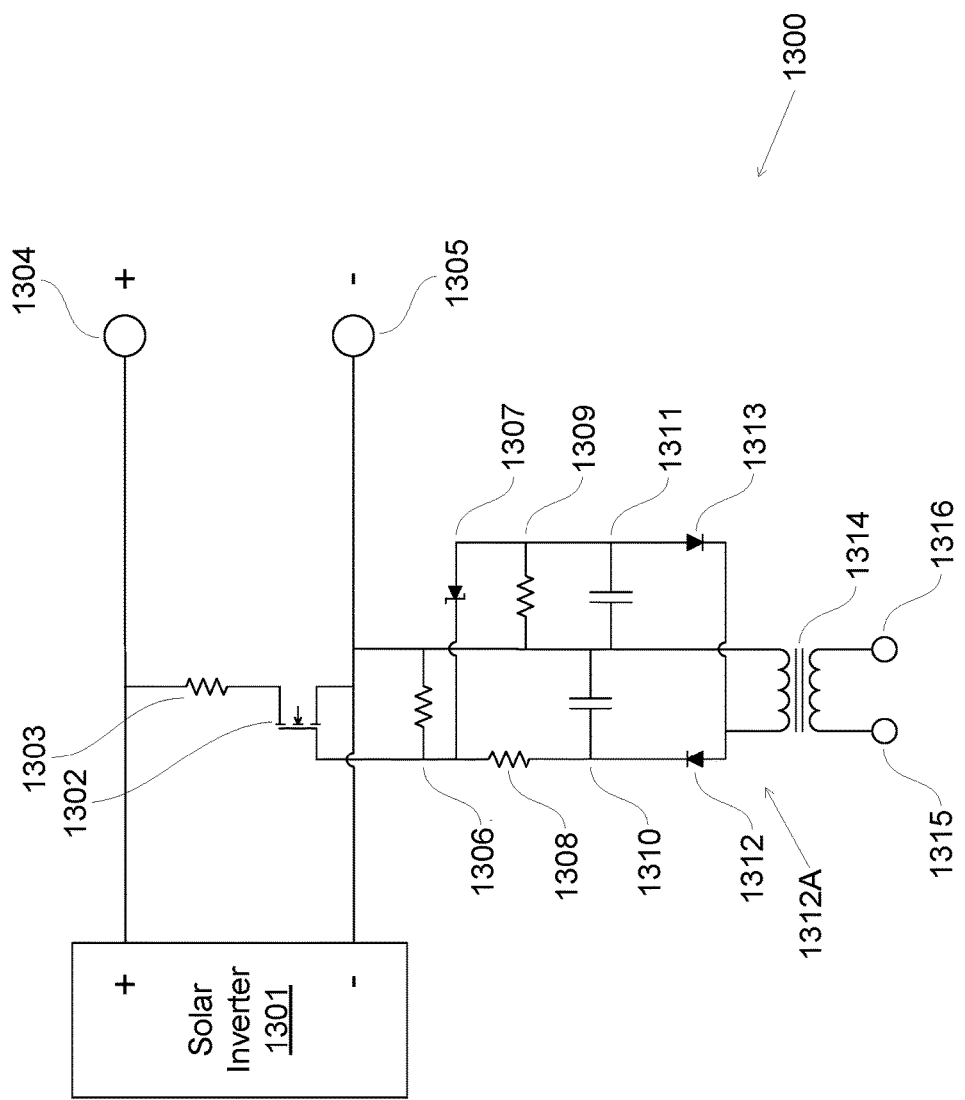
FIG. 13 is a schematic of a solar inverter circuit utilizing an isolation transformer and an enhancement-mode MOSFET to safely discharge the capacitor bank in a solar inverter according to one embodiment.

FIG. 13 is a schematic of a solar inverter circuit 1300 utilizing an isolation transformer 1314 and an enhancement-mode MOSFET 1302 to safely discharge the capacitor bank in a solar inverter 1301 according to one embodiment. FIG. 13 is a variant of FIG. 12. The default, zero-energy state of MOSFET 1202 in FIG. 12 is on. Thus, any failure in one of the components generating the negative gate voltage would lead to MOSFET 1202 being on. This would place discharge resistor 1203 across the inverter input terminals 1204, 1205. Under normal shutdown conditions, this would be desirable but, if the loss of gate voltage occurred inadvertently, resistor 1203 would be subject to the full, continuous power from the solar PV module string, and, as a result, could burn out. The circuit 1300 of FIG. 13 discloses a method to avoid such an occurrence. Enhancement-mode MOSFET 1302 replaces depletion-mode MOSFET 1202 of FIG. 12. Because the default, zero-energy state of enhancement-mode MOSFET 1302 is off, discharge resistor 1303 will not be inadvertently placed across the inverter input terminals 1304, 1305. Instead of using the diode bridge 1208 in FIG. 12, diodes 1312, 1313 are configured as a voltage doubler 1312A to simultaneously provide both a negative and a positive DC voltage.

When the control terminals 1315, 1316 are connected into the current loop controlling the solar PV modules, current transformer 1314 produces an AC voltage at its secondary winding. This AC voltage is rectified by diodes 1312, 1313 to provide both a positive and a negative DC voltage. These voltages are smoothed by capacitors 1310 and 1311 to produce steady DC voltages. Because MOSFET 1302 is a N-Channel enhancement-mode MOSFET, it needs a positive gate voltage to turn it on. Thus, its gate is connected to capacitor 1310 which provides a steady positive voltage. However, under normal operating conditions, the negative voltage on capacitor 1311 is transferred to the MOSFET 1302 gate by zener diode 1307 which pulls the gate down to zero thus turning MOSFET 1302 off. The time constant on the positive side consisting of capacitor 1310 and resistors 1306 and 1308 can be larger than the time constant on the negative side consisting of capacitor 1311 and resistor 1309 to enable the circuit 1300 to work as intended.

Under normal operating conditions with a current passing though control terminals 1315, 1316, both a positive and negative DC voltage will be generated, but the voltage on the gate of MOSFET 1302 will be close to zero so it will be turned off. Under shutdown conditions when the current loop is not energized, the negative voltage on capacitor 1311 will decay faster than the positive voltage on capacitor 1310 due to the difference in time constants. Thus, the negative voltage that normally keeps MOSFET 1302 turned off via zener diode 1307 is no longer present and the positive voltage on capacitor 1310 can then turn on MOSFET 1302. This connects discharge resistor 1303 across inverter input terminals 1304, 1305, which rapidly discharges the capacitor bank. However, because isolation transformer 1314 is no longer generating a voltage at its secondary winding, the positive voltage on capacitor 1310 will decay. The time constant of capacitor 1310 and resistors 1306, 1308 can be chosen such that there is sufficient time for the inverter capacitor bank to discharge below 30 Volts before the voltage on capacitor 1310 dropped below the gate threshold voltage of MOSFET 1302. When the voltage on the MOSFET 1302 gate drops below the threshold voltage, MOSFET 1302 can turn off, thus removing resistor 1303 from the inverter input terminals 1304 and 1305. Thus, using this circuit, discharge resistor 1303 is only ever connected across the inverter input terminals for a brief period of time—just long enough to discharge the capacitor bank.

Figure 14:
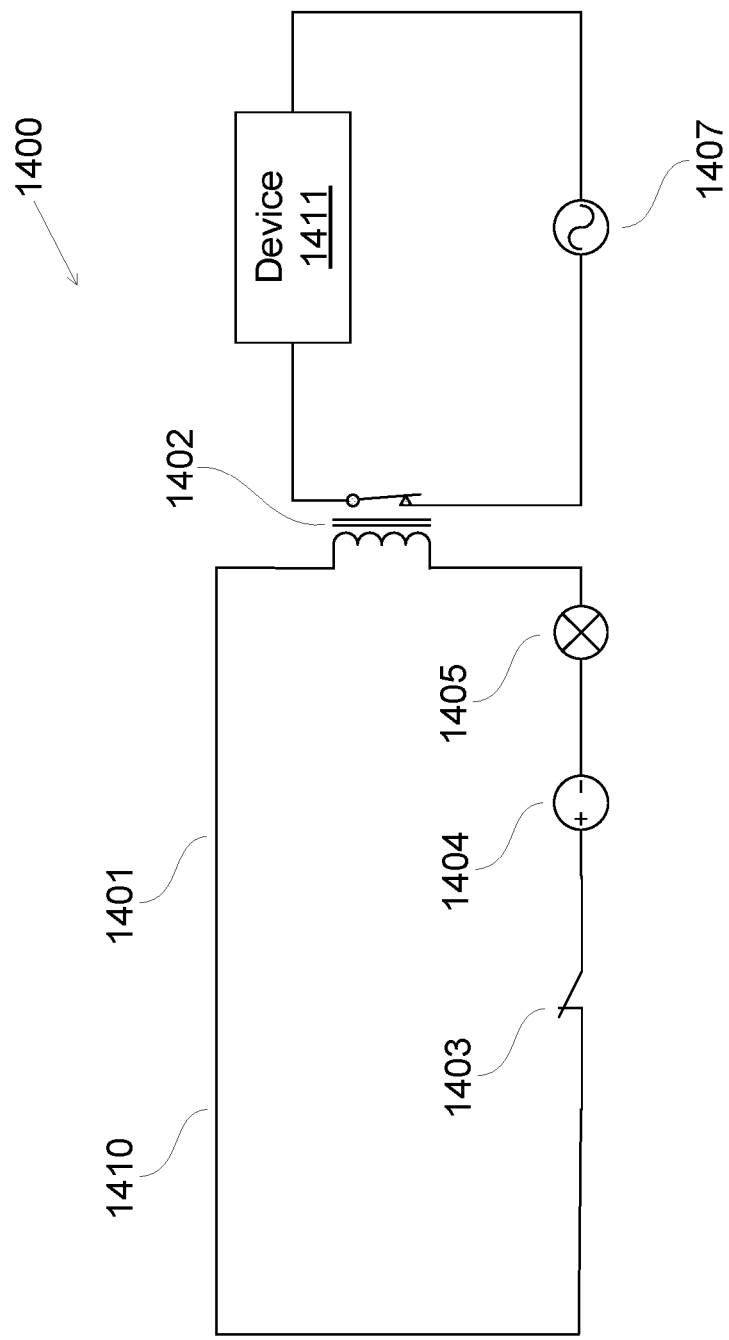
FIG. 14 is a schematic of a system utilizing low melting point wire in a current loop according to one embodiment.

FIG. 14 is a schematic of a system 1400 utilizing low melting point wire 1410 in a current loop 1401 according to one embodiment. The system includes an electrical source 1404 generating a control current; a control device 1402 configured to turn an electrical device 1411 (powered by current source 1407) on and off based on receipt of the control current; and low melting point wire 1410 operably coupling the electrical source 1404 and the control device 1402 in series. When the low melting point wire 1410 melts due to overheating, the control device 1402 stops receiving the control current, thereby causing the control device 1402 to turn off the electrical device 1411. As discussed above, the electrical device 1411 can be, for example, a solar photovoltaic module or a solar inverter. In the exemplified embodiment, the control device 1402 is a relay. In other embodiments, the control device can be another device for turning a device on and off. For example, the control device can include a current transformer.

FIG. 14 shows low melting point wire used as a distributed overheat or fire detection method. The current loop (sometimes referred to as "wire loop") 1401 can be routed anywhere it would be desirable to detect overheating or fire. This method has the advantage that the wire loop 1401 can be very long, limited only by the gauge of the wire and the energizing voltage. In this example, safety switching device 1403 is added so that manual control of the relay and performance verification are possible. Optional status indicator 1405 provides verification of whether current is flowing in the loop. The wire loop is powered by low-voltage electrical source 1404.

Figure 15:
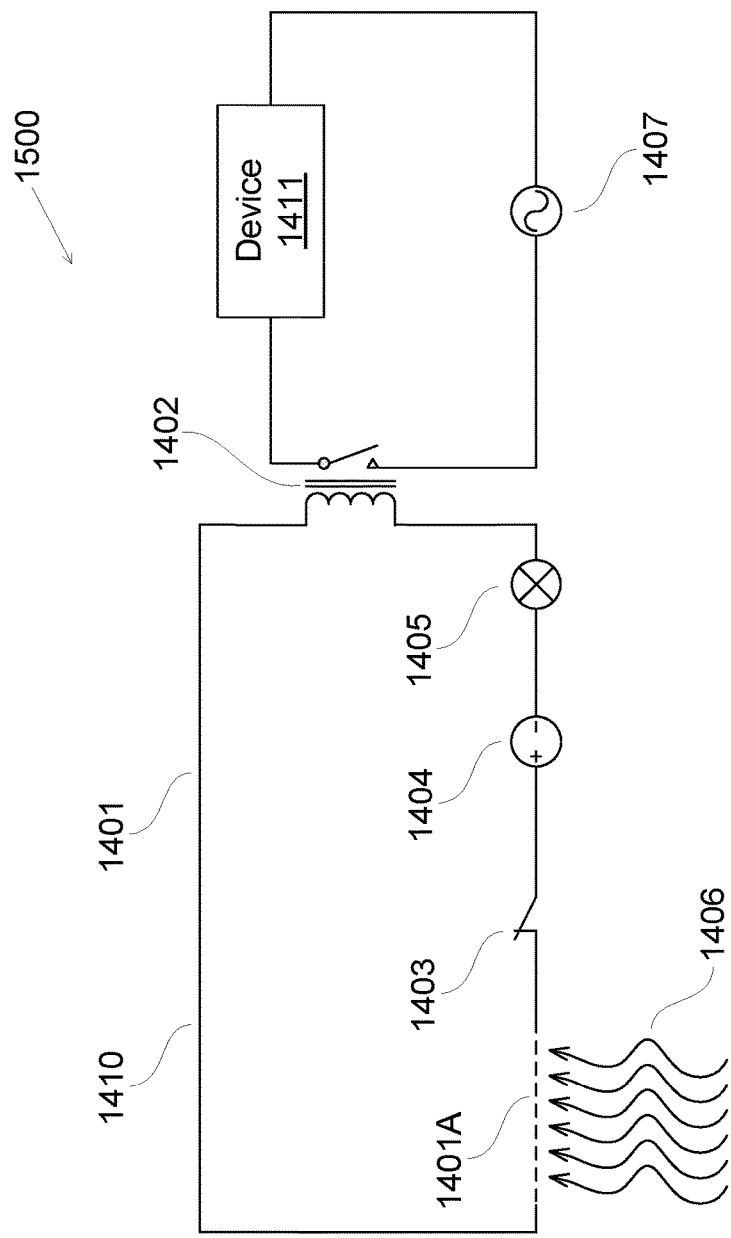
FIG. 15 is a schematic of a system utilizing low melting point wire in a current loop after a heat source has melted the wire according to one embodiment.

FIG. 15 is a schematic of a system 1500 utilizing low melting point wire 1410 in a current loop after a heat source has melted the wire according to one embodiment. FIG. 15 shows the system 1400 of FIG. 14 after heat or a fire 1406 has melted a portion 1401A of the low melting point wire 1410 used to connect the wire loop 1401. In this example, wire loop 1401 has been broken and current no longer flows. Consequently, the relay 1402 contacts are open, the status indicator 1405 is off, and the electrical device 1411 is shut off. Alternatively, the relay 1402 contacts could be connected to an alarm which would activate whenever the current in the wire failed to flow.

Figure 16:
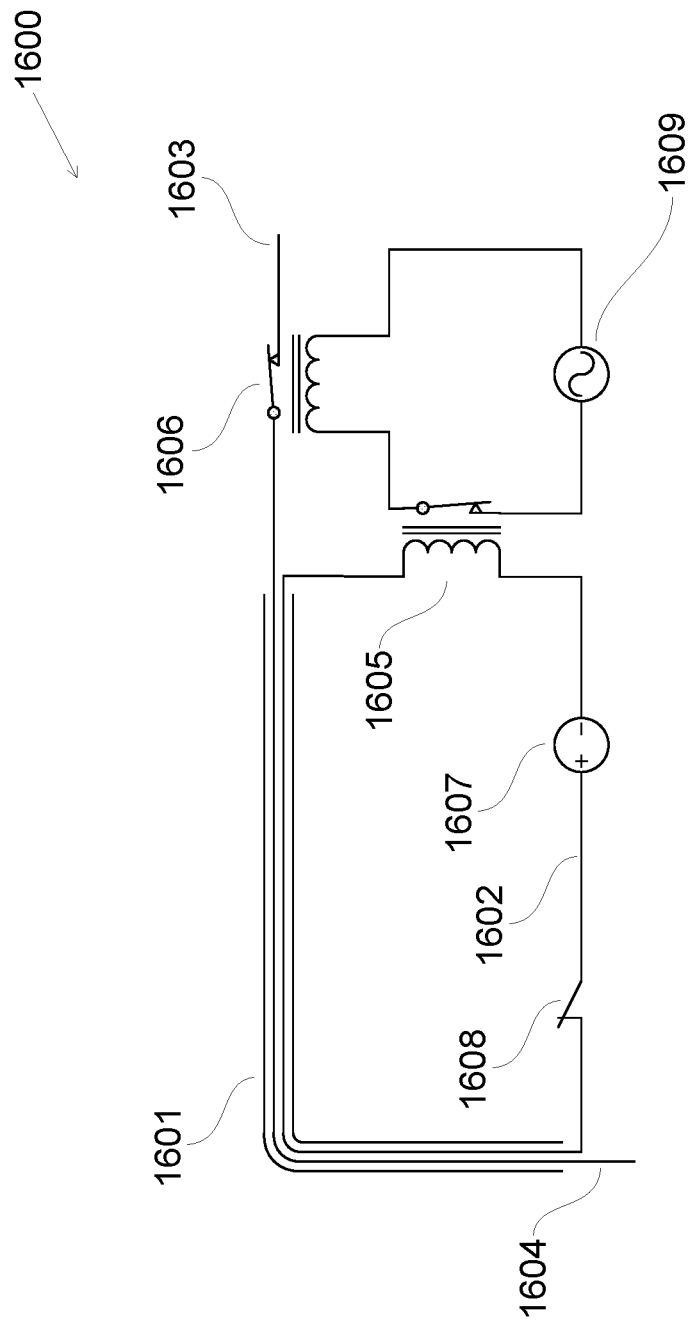
FIG. 16 is a schematic of a system utilizing low melting point wire in a current loop to protect an electrical service and shut it off in the event of over-heat or fire according to one embodiment.

FIG. 16 is a schematic of a system 1600 utilizing low melting point wire 1602 in a current loop to protect an electrical service and shut it off in the event of over-heat or fire according to one embodiment. This figure shows one of many possible applications of low melting point wire. Wire loop 1602 is installed inside electrical conduit 1601 along with the main electrical wiring 1604. If the conduit overheats or there is a fire, then a portion of the wire loop 1602 would melt and the relay 1605 contacts would open. These contacts control contactor 1606 which can shut off the electrical power from electrical service 1603. The wire loop 1602 is powered by low-voltage electrical source 1607 and the contactor is powered by AC current source 1609. Safety disconnect 1608 provides manual shutdown and performance verification. Those skilled in the art of electrical and electronic design would see many variants and other applications of this approach.

Figure 17:
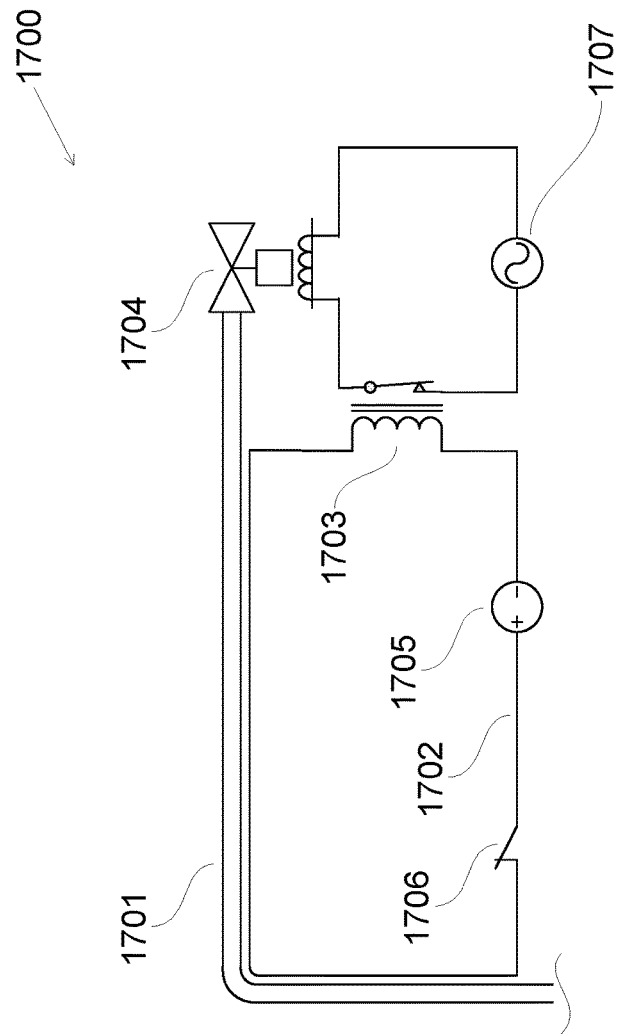
FIG. 17 is a schematic of a system utilizing low melting point wire in a current loop to shut off an electrically-operated valve in the event of over-heat or fire according to one embodiment.

FIG. 17 is a schematic of a system 1700 utilizing low melting point wire 1702 in a current loop to shut off an electrically-operated valve 1704 in the event of over-heat or fire according to one embodiment. This figure illustrates another application of the concept of FIG. 14. The wire loop 1702 is installed alongside a pipe 1701 or equipment in a chemical plant. If the pipe 1701 or equipment overheats or there is a fire, then a portion of the low melting point wire 1702 would melt and the relay 1703 contacts would open. Relay 1703 contacts are used to control electrically-operated valve 1704 which would automatically shut down if there was a problem. Similarly, if the wire loop 1702 was broken by physical damage then the valve 1704 would be shut down. Safety disconnect 1706 provides manual shutdown and performance verification. The wire loop is powered by low-voltage source 1705 and electrically-operated valve 1704 is powered by source 1707.

Figure 18:
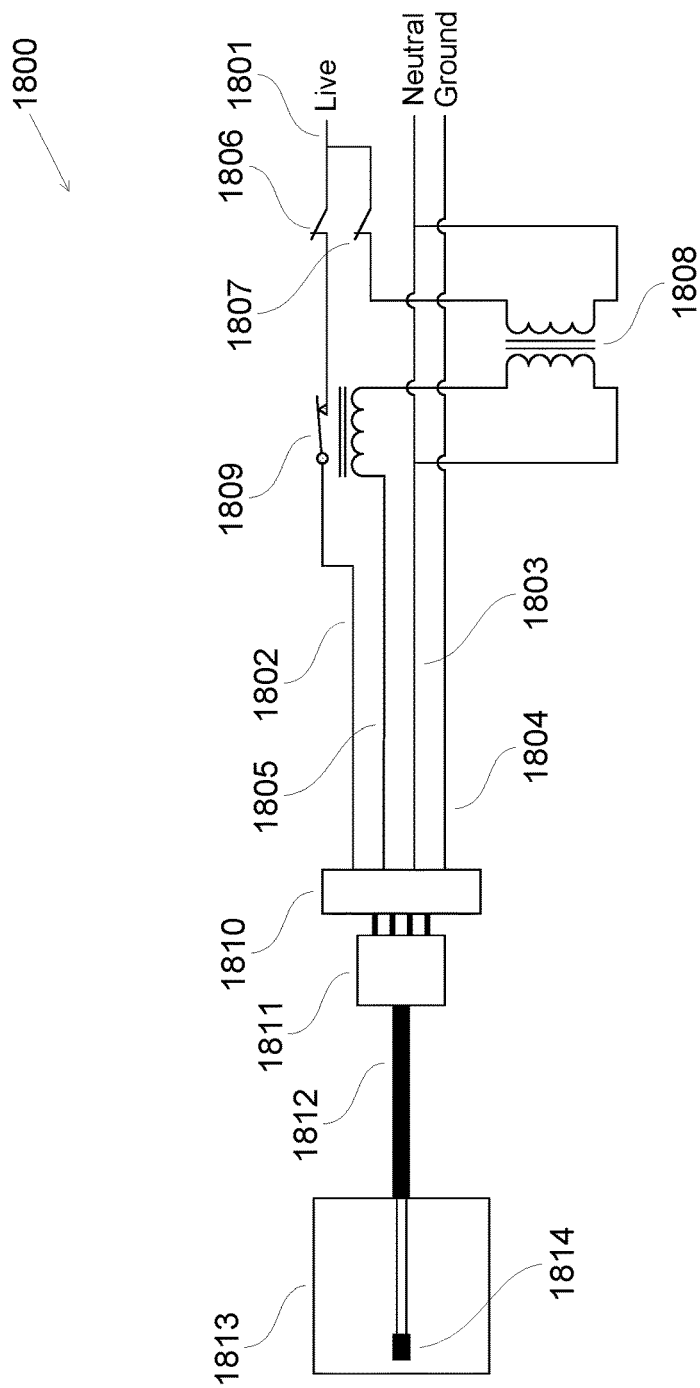
FIG. 18 is a schematic of a system utilizing low melting point wire in a current loop to protect an AC branch circuit and electrical equipment from over-heat or fire according to one embodiment.

FIG. 18 is a schematic of a system 1800 utilizing low melting point wire in a current loop 1805 to protect an AC branch circuit and electrical equipment from overheating or fire according to one embodiment. This figure shows another application of the concept of FIG. 14. In this embodiment, the wire loop 1805 is included within building and equipment wiring to provide automatic shutdown in the event of overheating or fire. The low voltage transformer 1808 is powered through circuit breaker 1807 by the electrical service 1801, 1803 and used to energize the wire loop 1805 and the relay 1809 coil. In one embodiment, 12 Volts RMS would be a practical voltage for the transformer 1808 secondary winding which would not present any danger to life, but other transformer voltages could be used. A 4-pin receptacle 1810 and 4-pin plug 1811 are required in order to carry the extra safety wire (low melting point wire) 1805. The neutral wire 1803 is used as the return for the sensing loop and the low melting point wire 1805 is joined to the neutral at point 1814 inside the equipment 1813 which allows the wire loop to be routed in the proximity of any components which may overheat or catch fire. Live wire 1801 passes through circuit breaker 1806 and relay 1809 contacts to the equipment 1813 via receptacle 1810, plug 1811, and power cord 1812. Ground wire 1804 connects to the equipment 1813 chassis via receptacle 1810, plug 1811 and power cord 1812.

The wire loop 1805 provides protection along the entire length of the branch circuit, the power cord 1812 and inside the equipment 1813 itself. An unusually high temperature anywhere along the length of the loop would melt a portion of the wire 1805 and break the loop. Relay 1809 would then shut off thus opening the live (or phase) wire 1801 and 1802 and removing all power to that circuit. If an electrical fault was the cause of the overheating this method will shut off the electrical power before the fault gets any worse and thereby potentially prevent a fire from starting. This method has the additional advantage that the power to the receptacle will remain off until 4-pin plug 1811 is plugged into receptacle 1810 and completes the wire loop 1805. This renders receptacle 1810 normally safe until an appliance is plugged in.

Figure 19:
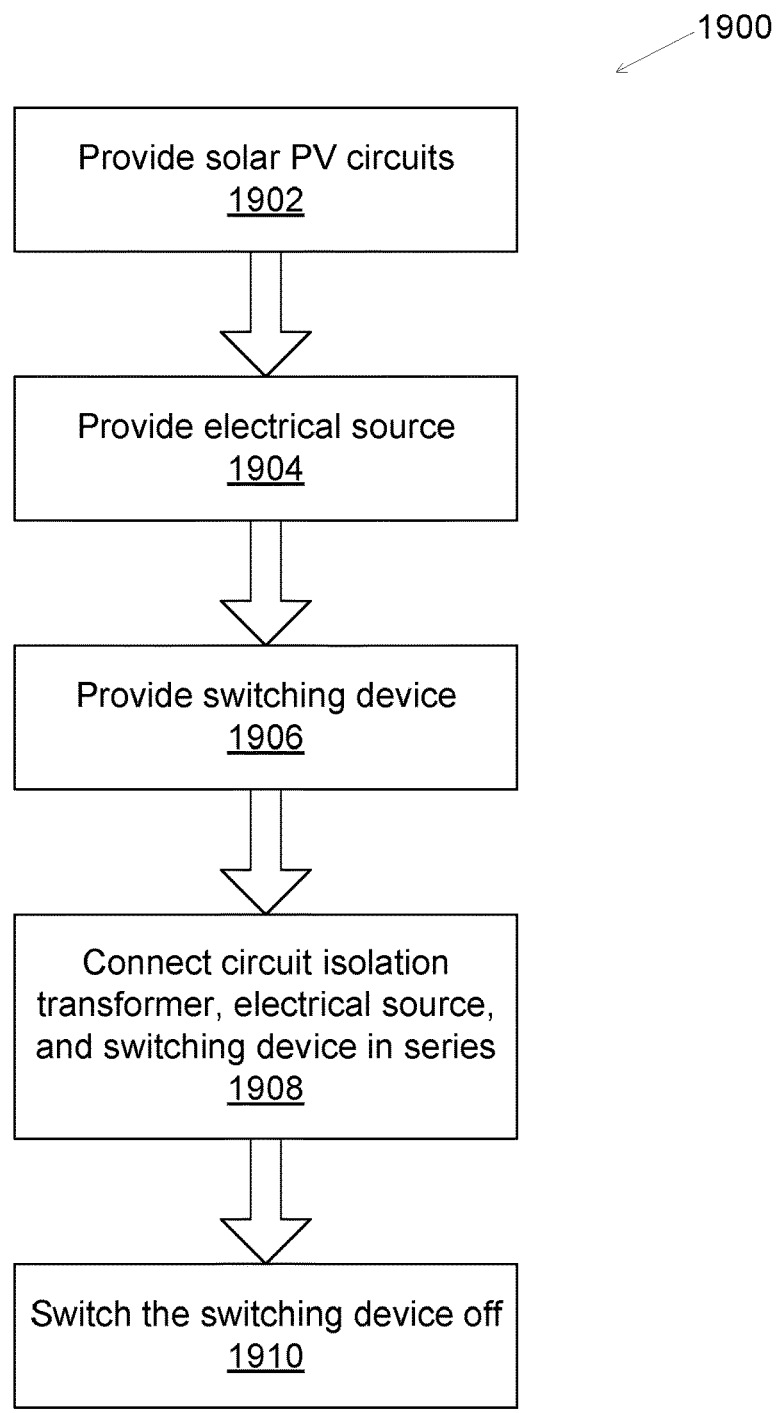
FIG. 19 is a flow chart of a method of shutting down solar modules simultaneously according to one embodiment.

FIG. 19 is a flow chart of a method 1900 of shutting down solar modules simultaneously according to one embodiment. The method includes providing a plurality of circuits, each circuit comprising a solar photovoltaic module, and a control circuit configured to turn the solar photovoltaic module on and off, each control circuit comprising an isolation transformer (operation 1902). Further, the method includes providing an electrical source configured to provide a control current (operation 1904). Further, the method includes providing a switching device configured to switch on and off (operation 1906). Further, the method includes electrically connecting the isolation transformers, the electrical source, and the switching device in series to form a current loop, the current loop transmitting the control current (operation 1908). Further, the method includes switching the switching device from on to off to stop the transmission of the control current in the current loop (operation 1910). In other embodiments, the solar photovoltaic module can be another type of electrical device. Further, other variations discussed above can be applied to the above method.

While the invention or inventions have been described with respect to specific examples, those skilled in the art will appreciate that there are numerous variations and permutations of the above described invention(s). It is to be understood that other embodiments may be utilized and structural and functional modifications may be made without departing from the scope of the present invention(s). Thus, the spirit and scope should be construed broadly as set forth in the appended claims.

The invention claimed is:

1. A system comprising:
a plurality of circuits, each circuit comprising:
an electrical device, and
a control circuit configured to turn the electrical device on and off, each control circuit comprising a current transformer having a primary winding and a secondary winding, the secondary winding operably coupled to the electrical device;
an alternating current (AC) constant current source providing a substantially constant control current, the AC constant current source not being a step down transformer directly connected to an AC mains panel;
a switching device configured to switch on and off; and
conductors connecting the primary winding of each of the current transformers of the plurality of circuits, the AC constant current source, and the switching device in series to form a current loop, the current loop transmitting the substantially constant control current;
wherein when the switching device is switched from on to off, the current transformers of the plurality of circuits stop receiving the control current, thereby causing the electrical devices of the plurality of circuits to shut off simultaneously.

2. The system of claim 1 wherein:
each control circuit comprises a MOSFET operably coupled to the current transformer and the electrical device, the MOSFET having an on state and an off state; and
for each control circuit, when the current transformer stops receiving the control current, the MOSFET switches to the off state, thereby shutting off the electrical device.

3. The system of claim 2 wherein each control circuit further comprises a diode bridge operably coupled between the current transformer and the MOSFET, the diode bridge configured to rectify a secondary current from a secondary winding of the current transformer.

4. The system of claim 3 wherein each control circuit further comprises a smoothing capacitor configured to (a) receive the rectified secondary current and (b) provide a DC voltage to the MOSFET to turn on the MOSFET.

5. The system of claim 4 wherein each control circuit further comprises a resistor configured to (a) convert the secondary current to the desired voltage and (b) discharge voltage on the smoothing capacitor when the control current in a primary winding of the current transformer is turned off.

6. The system of claim 5 wherein the resistor and the smoothing capacitor are connected in parallel.

7. The system of claim 6 wherein each of the smoothing capacitor and the resistor are connected (a) at a first terminal to a first electrical device terminal and (b) at a second terminal to a gate of the MOSFET.

8. The system of claim 1 wherein the electrical device of each circuit is a solar photovoltaic module, each solar photovoltaic module comprising photovoltaic cells.

9. The system of claim 1 wherein each control circuit comprises an enhancement mode MOSFET operably coupled to the current transformer and the electrical device.

10. The system of claim 1 wherein each control circuit comprises a depletion mode MOSFET operably coupled to the current transformer and the electrical device.

11. The system of claim 10 wherein:
the depletion mode MOSFET of each control circuit has an on state and an off state; and
for each control circuit, when the current transformer stops receiving the control current, the depletion mode MOSFET switches to the on state to short the electrical device, thereby shutting off the electrical device.

12. The system of claim 1 wherein each control circuit comprises:
an enhancement mode MOSFET operably coupled to the current transformer and the electrical device;
a depletion mode MOSFET operably coupled to the current transformer and the electrical device; and
a voltage doubler operably coupled to the enhancement mode MOSFET and the depletion mode MOSFET.

13. The system of claim 1 further comprising a thermal fuse operably coupled to each current transformer of the plurality of circuits.

14. The system of claim 1 wherein the electrical device of each circuit is a solar inverter.

15. The system of claim 1 wherein the switching device is a manual switch.

16. The system of claim 1 wherein the conductors comprise low melting point wire that melts when overheated.

17. The system of claim 1,
wherein the control current of the AC constant current source has a current value; and
wherein; the AC constant current source is configured such that the constant current value, when the switching device is switched on and the control current is being transmitted, is not affected, or affected only minimally, by (a) a change in an impedance of the conductors forming the current loop, the conductors being wires, or (b) a voltage drop caused by adding a new circuit to the plurality of circuits.

18. A method of shutting down a plurality of solar modules simultaneously, the method comprising:
providing a plurality of circuits, each circuit comprising:
a solar photovoltaic module, and
a control circuit configured to turn the solar photovoltaic module on and off, each control circuit comprising a current transformer;
providing an AC constant current source configured to provide a substantially constant control current, the AC constant current source not being a step down transformer directly connected to an AC mains panel;
providing a switching device configured to switch on and off; and
electrically connecting the current transformers, the AC constant current source, and the switching device in series to form a current loop, the current loop transmitting the substantially constant control current; and
switching the switching device from on to off to stop the transmission of the control current in the current loop.

19. The method of claim 18,
wherein the control current of the AC constant current source has a current value; and
wherein; the AC constant current source is configured such that the constant current value, when the switching device is switched on and the control current is being transmitted, is not affected, or affected only minimally, by (a) a change in an impedance of the conductors forming the current loop, the conductors being wires, or (b) a voltage drop caused by adding a new circuit to the plurality of circuits.

* * * * *